(12) United States Patent
Tanaka et al.

(10) Patent No.: US 11,579,211 B2
(45) Date of Patent: Feb. 14, 2023

(54) DETECTION DEVICE

(71) Applicant: DENSO CORPORATION, Kariya (JP)

(72) Inventors: Ken Tanaka, Kariya (JP); Toshiro Suzuki, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 17/829,295

(22) Filed: May 31, 2022

(65) Prior Publication Data

US 2022/0291297 A1 Sep. 15, 2022

Related U.S. Application Data

(63) Continuation of application No. 17/129,094, filed on Dec. 21, 2020, now Pat. No. 11,353,521, which is a continuation of application No. PCT/JP2019/024190, filed on Jun. 19, 2019.

(30) Foreign Application Priority Data

Jun. 28, 2018 (JP) .............................. JP2018-123160
Oct. 17, 2018 (JP) .............................. JP2018-195711

(51) Int. Cl.
*G01R 33/00* (2006.01)
*G01D 5/14* (2006.01)
*G01D 5/16* (2006.01)

(52) U.S. Cl.
CPC ......... *G01R 33/0047* (2013.01); *G01D 5/142* (2013.01); *G01D 5/16* (2013.01)

(58) Field of Classification Search
CPC ............ G01R 33/0047; G01R 33/0011; G01R 33/0076; G01R 33/072; G01R 33/091; G01D 5/142; G01D 5/16; G01D 5/24442; G01L 3/104; G01L 5/221
USPC ..................................................... 324/207.12
See application file for complete search history.

(56) References Cited

U.S. PATENT DOCUMENTS

| | | | |
|---|---|---|---|
| 5,121,289 A | 6/1992 | Gagliardi | |
| 5,414,355 A | 5/1995 | Davidson et al. | |
| 5,563,510 A | 10/1996 | Gorrell et al. | |
| 5,631,557 A | 5/1997 | Davidson | |
| 6,064,200 A | 5/2000 | Saito et al. | |
| 6,504,366 B2 | 1/2003 | Bodin et al. | |
| 7,190,160 B2 | 3/2007 | Hattori | |
| 7,192,288 B2 | 3/2007 | Tanaka et al. | |

(Continued)

FOREIGN PATENT DOCUMENTS

| | | |
|---|---|---|
| EP | 2103919 A1 | 9/2009 |
| JP | 5153490 B2 | 2/2013 |
| JP | 2013212710 A | 10/2013 |

*Primary Examiner* — Christopher P McAndrew
(74) *Attorney, Agent, or Firm* — Posz Law Group, PLC

(57) ABSTRACT

A magnetic detection module is provided so as to be selectively mountable in any of housings having a plurality of specifications having different shapes or sizes of mounting portions, and detects magnetic flux generated in the housing. The magnetic detection module includes one or more magnetic sensors that detect magnetic flux, a case in which the magnetic sensors are housed, and a cap that can be attached to an end of the case and is provided with a sealing member. The magnetic detection module can be attached to the housing of the first specification with the cap not attached to the case, and can be attached to the housing of the second specification through a sealing member with the cap attached to the case.

6 Claims, 29 Drawing Sheets

(56) References Cited

U.S. PATENT DOCUMENTS

| | | |
|---|---|---|
| 7,372,258 B2 | 5/2008 | Okui et al. |
| 8,776,619 B2 | 7/2014 | Jammer |
| 8,836,267 B2 | 9/2014 | Aoki |
| 10,371,712 B2 | 8/2019 | Boro et al. |
| 11,112,321 B2 | 9/2021 | Tanaka et al. |
| 2005/0223820 A1 | 10/2005 | Murakami et al. |
| 2007/0290679 A1* | 12/2007 | Okui ................ G01P 1/026 |
| | | 324/207.25 |
| 2009/0039880 A1 | 2/2009 | Nomura et al. |
| 2010/0071481 A1 | 3/2010 | Arita et al. |
| 2019/0064016 A1 | 2/2019 | Rey |
| 2019/0226925 A1 | 7/2019 | Maehara |
| 2020/0041366 A1 | 2/2020 | Tanaka et al. |

* cited by examiner

DETECTION DEVICE

CROSS REFERENCE TO RELATED APPLICATIONS

This application is a continuation of U.S. Utility application Ser. No. 17/129,094 filed on Dec. 21, 2020, which is a continuation application of International Patent Application No. PCT/JP2019/024190 filed on Jun. 19, 2019, which is based on and claims the benefits of priorities of Japanese Patent Application No. 2018-123160 filed on Jun. 28, 2018, and Japanese Patent Application No. 2018-195711 filed on Oct. 17, 2018. The entire disclosure of all of the above applications is incorporated herein by reference.

TECHNICAL FIELD

The present disclosure relates to a magnetic detection module, a detection device, a case assembly, and a production method for the magnetic detection module.

BACKGROUND

Conventionally, a detection device that detects a magnetic flux generated in response to a movement of a movable body is known.

SUMMARY

[Purpose of Disclosure of First Group]

A purpose of the disclosure of the first group is to provide a magnetic detection module that can be selectively attached to a plurality of housings having different specifications by a simple configuration change using a common component, a case assembly constituting the magnetic detection module, and its production method.

[Purpose of Disclosure of Second Group]

The purpose of the disclosure of the second group is to provide a detection device for preventing interference between a sensor unit protruding from the tip surface and a member on the housing side and a magnetic detection module, in the detection device in which a magnetic detection module is mounted on a housing having a mounting hole whose inner wall has a cylindrical shape.

[Disclosure of First Group]

The magnetic detection module of the present disclosure is provided so as to be selectively mountable in any of housings having a plurality of specifications having different shapes or sizes of mounting portions, and detects magnetic flux generated in the housing. The magnetic detection module includes one or more magnetic sensors that detect magnetic flux, a case in which the magnetic sensors are housed, and a cap that can be attached to an end of the case and is provided with a sealing member.

[Disclosure of Second Group]

The detection device of the present disclosure includes a housing and a magnetic detection module. The housing has a mounting hole provided inside with a set of yokes that transmit the magnetic flux generated according to a magnitude of a physical quantity to be detected. The magnetic detection module is mounted in a mounting hole in the housing and detects the magnetic flux transmitted from the yoke by one or more magnetic sensors housed in a case. A set of yokes face each other and have rings that form a magnetic circuit.

BRIEF DESCRIPTION OF DRAWINGS

The above and other objects, features and advantages of the present disclosure will become more apparent from the following detailed description made with reference to the accompanying drawings. In the drawings.

DETAILED DESCRIPTION

Figure 1:
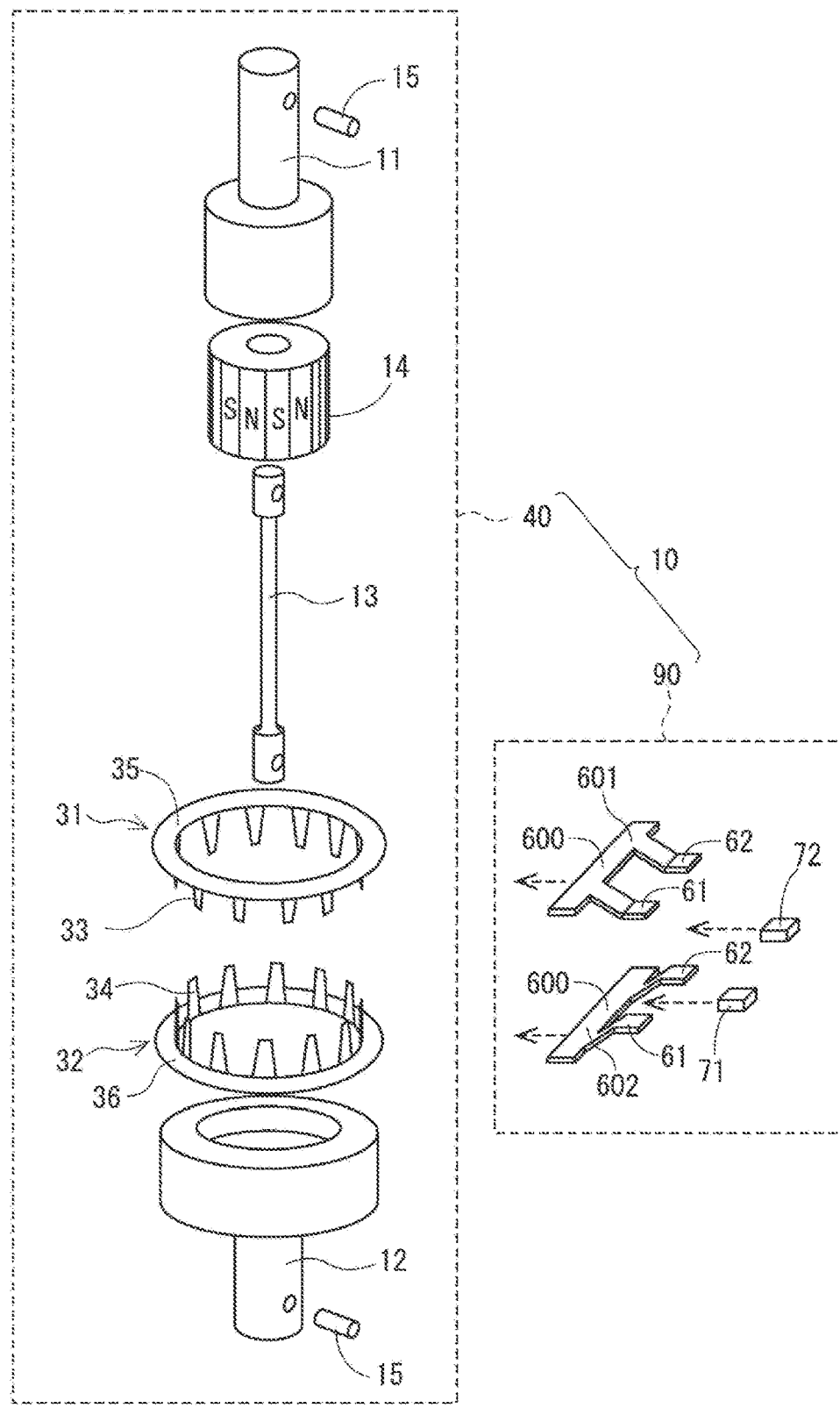
FIG. 1 is an exploded perspective view illustrating a basic configuration of a torque detection device to which a magnetic detection module is applied.

In an assumable example, a detection device that detects a magnetic flux generated in response to a movement of a movable body is known. In a power steering device of a vehicle, for example, a torque sensor uses a magnetic sensor to detect changes in magnetic flux generated by a torsional displacement of a torsion bar housed in a housing, and detects a steering torque. This torque sensor has a cylinder portion having a spigot structure that is joined to a mounting hole of a housing in a sensor holder. A seal member is compressed and interposed between the mounting hole of the housing and an outer peripheral surface of the cylinder portion with the spigot structure to seal between the two. Then, an elastic force of the seal member acts on the cylinder portion with the spigot structure in a radial direction of the outer peripheral surface of the cylinder portion.

Further, a detection device has a configuration in which a magnetic detection module including a magnetic sensor is inserted into a mounting hole of a housing. For example, in a torque detection device, a case (that is, a magnetic detection module) including a detection unit, a detection circuit board, and the like is inserted into a through hole (that is, a mounting hole) from a radial direction of the housing. An outer end of the through hole in the housing and an outer surface of the case have positioning surfaces that determine the position of the detection unit in the housing.

[First Viewpoint]

Generally, as a structure of a detection device that detects magnetic flux generated in response to movement of a movable body, a magnetic detection module having a magnetic sensor and outputting a detection signal to the outside is attached to a housing in which a movable body and a magnetic flux generating portion are housed. The magnetic detection module includes a case assembly in which the magnetic sensor is housed in the case. The case assembly includes a substrate on which a signal output circuit is mounted, a connector to which a signal line is wired, and the like in addition to the magnetic sensor. With such a module structure, in an actual product, the magnetic detection module supplied as a component from another place is attached to the housing at an assembly factory.

By the way, the torque sensor disclosed in Patent Document 1 includes a seal member, but in reality, depending on the part of the vehicle on which the torque sensor is mounted, the rack-mounted type is required to have a waterproof function, and the column-mounted type is not required to have a waterproof function. Therefore, when applied to a waterproof detection device, it is necessary to provide a sealing member between the magnetic detection module and the housing. When applied to non-waterproof detection device, it is not necessary to provide a sealing member between the magnetic detection module and the housing.

If a case dedicated to each of the waterproof and non-waterproof housings is manufactured by, for example, resin molding, two types of molds are required, and production adjustment and inventory management man-hours for the two types of cases are required. Further, for example, when there are a plurality of specifications having different shapes and sizes of sealing members among the waterproof specifications, it is necessary to switch the production of other models, and the mold cost and the management cost are increased.

[Second Viewpoint]

In the configuration of Patent Document 2, an inner wall of the mounting hole of the housing has a rectangular tubular shape. On the other hand, Patent Document 2 does not specifically specify the positioning configuration when the inner wall of the mounting hole of the housing has a cylindrical shape.

Further, in the configuration of Patent Document 2, since an outer peripheral of the insertion portion is surrounded by a magnetic ring, there is no risk that the housing portion of the magnetic sensor will come into direct contact with the housing during the insertion work and be damaged. On the other hand, in a configuration in which the sensor unit in which the magnetic sensor is housed protrudes from a tip surface of the magnetic detection module, if the sensor unit interferes with a member on the housing side due to misalignment or tilt during insertion, the magnetic sensor may be damaged or its characteristics may change.

[Purpose of Disclosure of First Group]

A purpose of the disclosure of the first group is to provide a magnetic detection module that can be selectively attached to a plurality of housings having different specifications by a simple configuration change using a common component, a case assembly constituting the magnetic detection module, and its production method.

[Purpose of Disclosure of Second Group]

The purpose of the disclosure of the second group is to provide a detection device for preventing interference between a sensor unit protruding from the tip surface and a member on the housing side and a magnetic detection module, in the detection device in which a magnetic detection module is mounted on a housing having a mounting hole whose inner wall has a cylindrical shape.

[Disclosure of First Group]

The magnetic detection module of the present disclosure is provided so as to be selectively mountable in any of housings having a plurality of specifications having different shapes or sizes of mounting portions, and detects magnetic flux generated in the housing. The magnetic detection module includes one or more magnetic sensors that detect magnetic flux, a case in which the magnetic sensors are housed, and a cap that can be attached to an end of the case and is provided with a sealing member.

This magnetic detection module can be attached to the housing of the first specification with the cap not attached to the case, and can be attached to the housing of the second specification through the sealing member with the cap attached to the case. The sealing member is not provided at the time when the cap is attached to the case, and may be provided before the cap is attached to the housing.

For example, this magnetic detection module further includes one or more magnetic flux guiding members in the case that guide the detected magnetic flux to the magnetic sensor.

In the present disclosure, the mounting specifications for the housing can be changed depending on the presence or absence of the cap. Specifically, for the waterproof housing, a magnetic detection module in which a cap provided with a sealing member is attached to the case is supplied. Further, for the non-waterproof housing, the case assembly without the cap is independently supplied as a magnetic detection module. Therefore, for example, when the case is manufactured by resin molding, only one type of mold is required for the case, and inventory management is simplified.

In addition, a case assembly that constitutes the above magnetic detection module is provided. The case assembly includes one or more magnetic sensors that detect magnetic flux and a case that houses the magnetic sensor. This case assembly can be independently attached to the housing of the first specification, and can be attached to the housing of the second specification through the sealing member with the cap provided with the sealing member attached to the end of the case.

Further, a production method for the above-mentioned magnetic detection module is provided. The production method of this magnetic detection module includes a storage process, a selection process, and a mounting process. In the storage process, one or more magnetic sensors that detect magnetic flux are housed in a case, and a case assembly is manufactured. In the selection process, according to the specifications of the housing to be attached, it is selected whether to use the case assembly alone or to attach a cap set for each housing specification to the end of the case. In the mounting process, when it is selected to mount the cap on the case in the selection step, the cap is mounted and fixed to the case.

[Disclosure of Second Group]

The detection device of the present disclosure includes a housing and a magnetic detection module. The housing has a mounting hole provided inside with a set of yokes that transmit the magnetic flux generated according to a magnitude of a physical quantity to be detected. The magnetic detection module is mounted in a mounting hole in the housing and detects the magnetic flux transmitted from the yoke by one or more magnetic sensors housed in a case. A set of yokes face each other and have rings that form a magnetic circuit.

The mounting hole of the housing has a large hole formed on an opening side and a small hole formed in a back of the large hole. The magnetic detection module has a cylinder portion and a sensor unit. The cylinder portion has a large shaft portion that faces the inner wall of the mounting hole and is inserted into the large hole, and a small shaft portion that is inserted into the small hole. The cylinder portion may be integrally formed with the case. Alternatively, the cylinder portion may be composed of a plate-shaped cap body of a cap attached to an end portion of the case. The sensor unit accommodates the magnetic sensor, projects from the tip surface of the cylinder portion, and is inserted between the ring portions of the set of yokes.

A minimum distance between the sensor unit and the ring portion in a direction orthogonal to the axial direction of the mounting hole and the cylinder portion is defined as "sensor margin". At least one of the one-sided fitting gap between the large hole and the large shaft portion or the one-sided fitting gap between the small hole and the small shaft portion is set to be smaller than the sensor margin.

For example, the "cylindrical portion" is formed as a cylindrical "cylindrical portion". In this case, "large hole", "small hole", "large shaft part" and "small shaft part" are read as "large diameter hole", "small diameter hole", "large diameter part" and "small diameter part", respectively. Further, the "direction orthogonal to the axial direction of the cylindrical portion" is read as "radial direction of the cylindrical portion".

As a result, the detection device of the present disclosure suppresses misalignment and inclination when the magnetic detection module is inserted into the mounting hole. Therefore, it is prevented that the sensor unit interferes with the ring portion of the yoke, which is a member on the housing side. In addition, a magnetic detection module attached to a housing in the above detection device is provided.

Hereinafter, a plurality of embodiments of a detection device and a magnetic detection module will be described with reference to the drawings. In the following embodiments, substantially same structural parts are designated with the same reference numerals thereby to simplify the description. The detection device of the present embodiment functions as a torque detection device that detects steering torque in an electric power steering device. Further, the magnetic detection module of the present embodiment is applied to the torque detection device. The first and second embodiments correspond to "disclosure of a first group". The third and fourth embodiments also correspond to "disclosure of a second group". In particular, a configuration in which an O-ring, which is a sealing member, is attached in the third embodiment also corresponds to "disclosure of the first group".

First, with reference to FIG. 1, a basic configuration of the torque detection device 10 as "detection device" will be described. The torque detection device 10 includes a magnetic detection module 90 and detects torque based on magnetic flux generated according to the input torque.

The torque detection device 10 includes an element housed in a housing 40 mounted on a vehicle and an element configured as a magnetic detection module 90 and attached to the housing 40. The element housed in the housing 40 includes a torsion bar 13, a multipolar magnet 14, a set of yokes 31, 32, and the like. The element configured as the magnetic detection module 90 include magnetic flux guiding members 601, 602, magnetic sensors 71, 72 and the like.

One end portion of the torsion bar 13 is fixed to an input shaft 11 with a pin 15, and another end portion of the torsion bar 13 is fixed to an output shaft 12 with a pin 15 so that the input shaft 11 and the output shaft 12 are connected on a same axis as a central axis O. The torsion bar 13 is an elastic member having a rod shape for converting a steering torque applied to a steering shaft 94 to a torsional displacement. In the multipolar magnet 14, which is secured to the input shaft 11, the N-poles and S-poles are disposed alternately in a circumferential direction.

The set of yokes 31 and 32 is made of a soft magnetic material and is fixed to the output shaft 12 on an outer diameter of the multipolar magnet 14. Each yoke 31, 32 has a ring portion 35, 36 facing each other via a gap in an axial direction, and a plurality of claws 33, 34 extending axially from an inner peripheral edge of each ring portion 35, 36 toward the other ring portion. The same number of claws 33 and 34 as the north and south poles of the multipolar magnet 14 are provided at equal intervals on the entire circumference along the inner peripheral edge of the ring portions 35 and 36. The claws 33 of the yoke 31 and the claws 34 of the yoke 32 are shifted in the circumferential direction, placed alternately. The pair of yokes 31 and 32 thus forms a magnetic circuit in a magnetic field generated by the multipolar magnet 14.

The central axis O may be defined using any of the torsion bar 13, the multipolar magnet 14, and the yokes 31 and 32 as the reference, since they are all placed concentrically. In the present specification, it is basically described as "the central axis O of the yokes 31 and 32" with reference to the yokes 31 and 32 in which the facing relationship with the magnetic flux guiding members 601 and 602 is focused. In the description of the embodiments, an axial direction and a radial direction of the torsion bar 13, the multipolar magnet 14, the yokes 31 and 32, and the like are simply referred to as the "axial direction" and the "radial direction."

The magnetic flux guiding members 601 and 602 of the magnetic detection module 90 are made from a soft magnetic member, and a set of yokes 31 and 32 and a main body 600 face each other in the axial direction to guide the magnetic flux of the magnetic circuit to the magnetic sensors 71 and 72. In the present embodiment, a set of magnetic flux guiding members 601 and 602 facing each other in the axial direction are provided.

Hereinafter, for convenience of explanation, the yoke 31 and the magnetic flux guiding member 601 arranged on the first shaft 11 side in FIG. 1 are referred to as "upper yoke 31" and "upper magnetic flux guiding member 601". Further, the yoke 32 and the magnetic flux guiding member 602 arranged on the second shaft 12 side are referred to as "lower yoke 32" and "lower magnetic flux guiding member 602". The upper magnetic flux guiding member 601 faces the upper yoke 31, and the lower magnetic flux guiding member 602 faces the lower yoke 32.

The set of magnetic flux guiding members 601 and 602 of the present embodiment has two extensions 61 and 62 branched from the main body 600. Specifically, the extensions 61 and 62 extend from the main body 600 toward the outside of the yokes 31 and 32 in the radial direction. The magnetic sensor 71 is disposed between the extensions 61, and the magnetic sensor 72 is disposed between the extensions 62. The extensions 61 each have a step in the axial direction so as to have a minimum gap therebetween in a location where the magnetic sensor 71 is placed. The extensions 62 each have a step in the axial direction so as to have a minimum gap therebetween in a location where the magnetic sensor 72 is placed.

The magnetic sensors 71 and 72 detect the magnetic flux induced by the magnetic flux guiding members 601 and 602 from the ring portions 35 and 36 of the set of yokes 31 and 32, convert it into a voltage signal, and output an external processing unit via a harness. Each of the magnetic sensors 71 and 72 is, for example, an IC package having a substantially rectangular parallelepiped shape, made using a Hall element, magneto-resistive element, or the like molded in resin. The magnetic detection module 90 of the present embodiment includes two magnetic sensors 71 and 72, and redundantly outputs two values as steering torque to the processing unit. With such a redundant configuration, the processing unit can continue to control even if one of the information becomes unusable due to a failure of the magnetic sensor or the arithmetic circuit.

Figure 27:
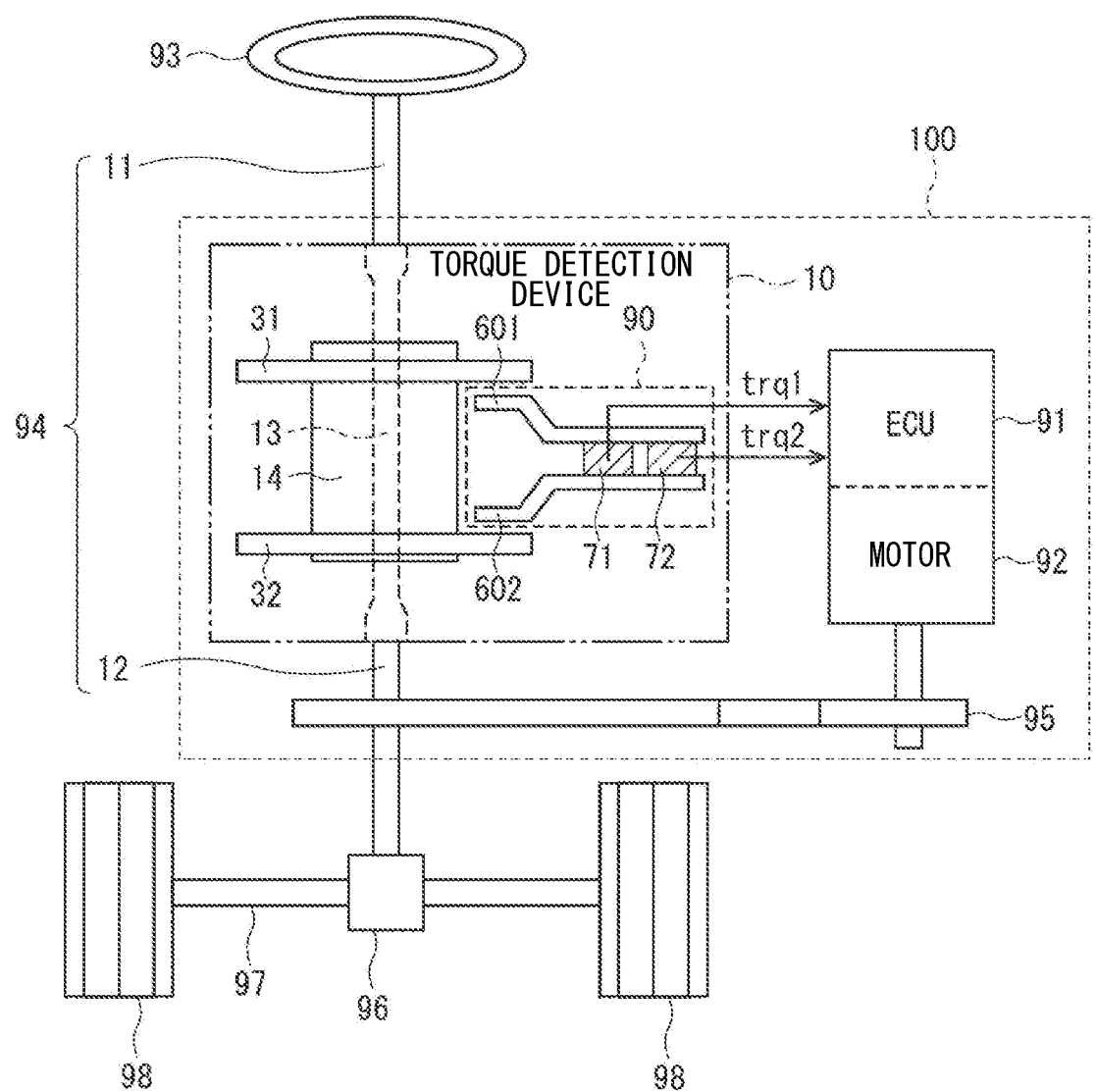
FIG. 27 is a schematic configuration diagram of an electric power steering device to which the torque detection device is applied.

Here, with reference to FIG. 27, a schematic configuration of an electric power steering device to which the torque detection device is applied will be described. While the electric power steering system 100 illustrated in FIG. 27 is of a column assist type, the torque detection device can be also used in rack assist electric power steering systems.

The torque detection device 10 for detecting steering torque is installed on a steering shaft 94 connected to a steering wheel 93. A pinion gear 96 is provided at a tip of the steering shaft 94, and a pinion gear 96 meshes with a rack shaft 97. A pair of wheels 98 are rotatably connected to both ends of the rack shaft 97 via a tie rod or the like. A rotational movement of the steering shaft 94 is converted into linear movement of the rack shaft 97 by the pinion gear 96, and the pair of road wheels 98 is steered.

The torque detection device 10 is provided between the input shaft 11 and the output shaft 12 constituting the steering shaft 94, detects the steering torque applied to the steering shaft 94, and outputs the torque to an ECU 91. The ECU 91 controls an output of a motor 92 in accordance with the detected steering torque. The motor 92 generates a steering assist torque that is reduced by a reduction gear 95 and transmitted to the steering shaft 94.

Figure 2A:
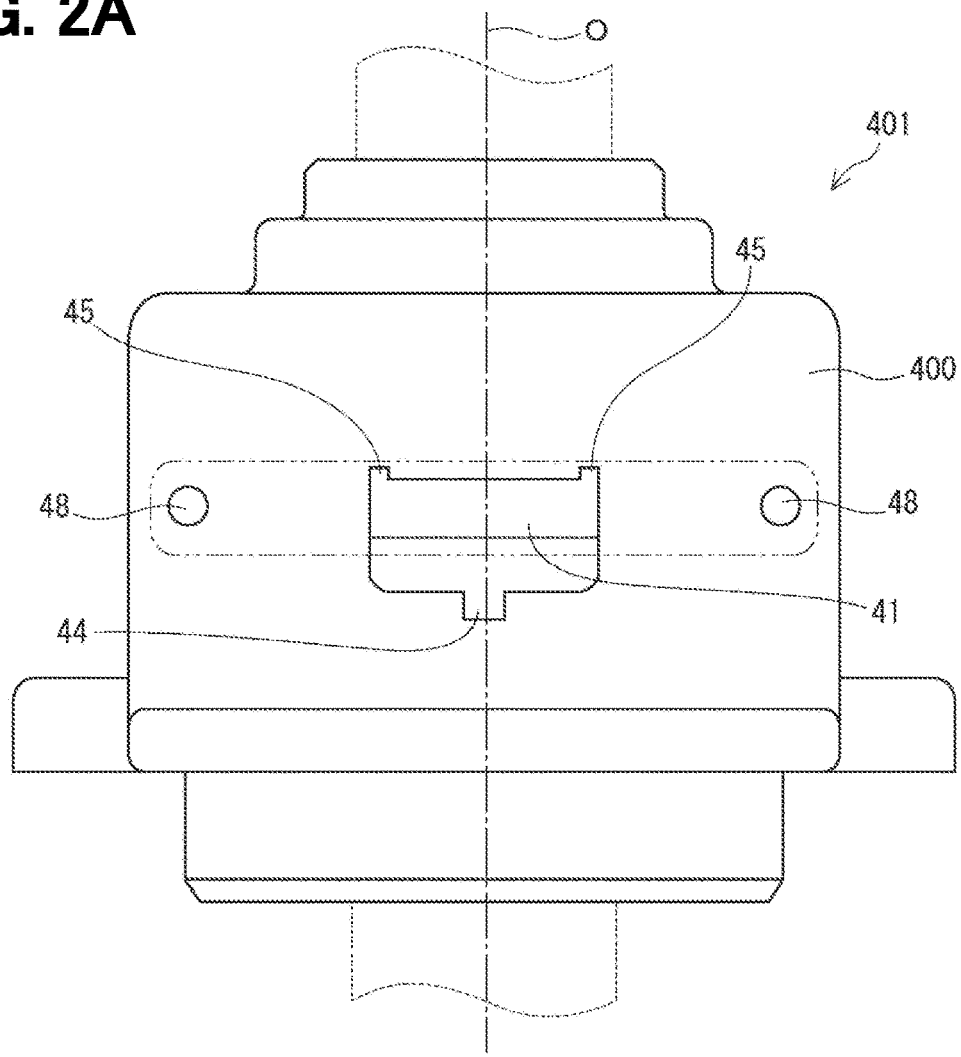
FIG. 2A is a front view of a magnetic detection module mounting portion of a housing in a column-mounted type (non-waterproof specification)
Figure 2B:
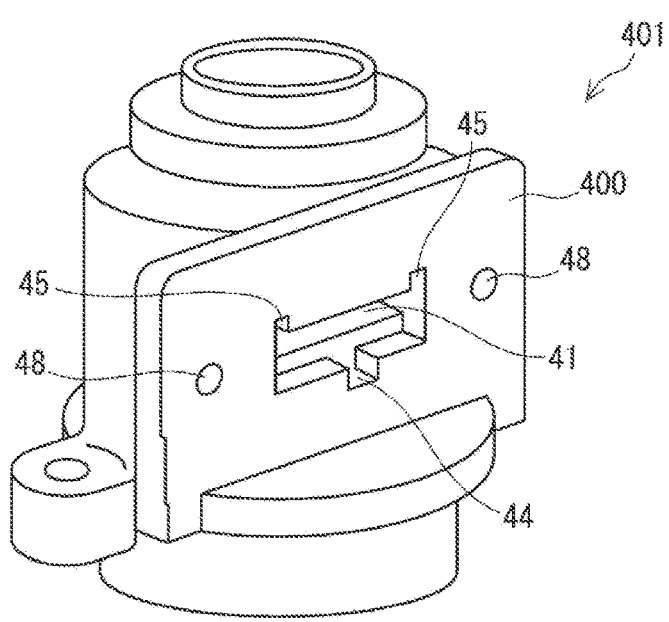
FIG. 2B is a perspective view of FIG. 2A.
Figure 3A:
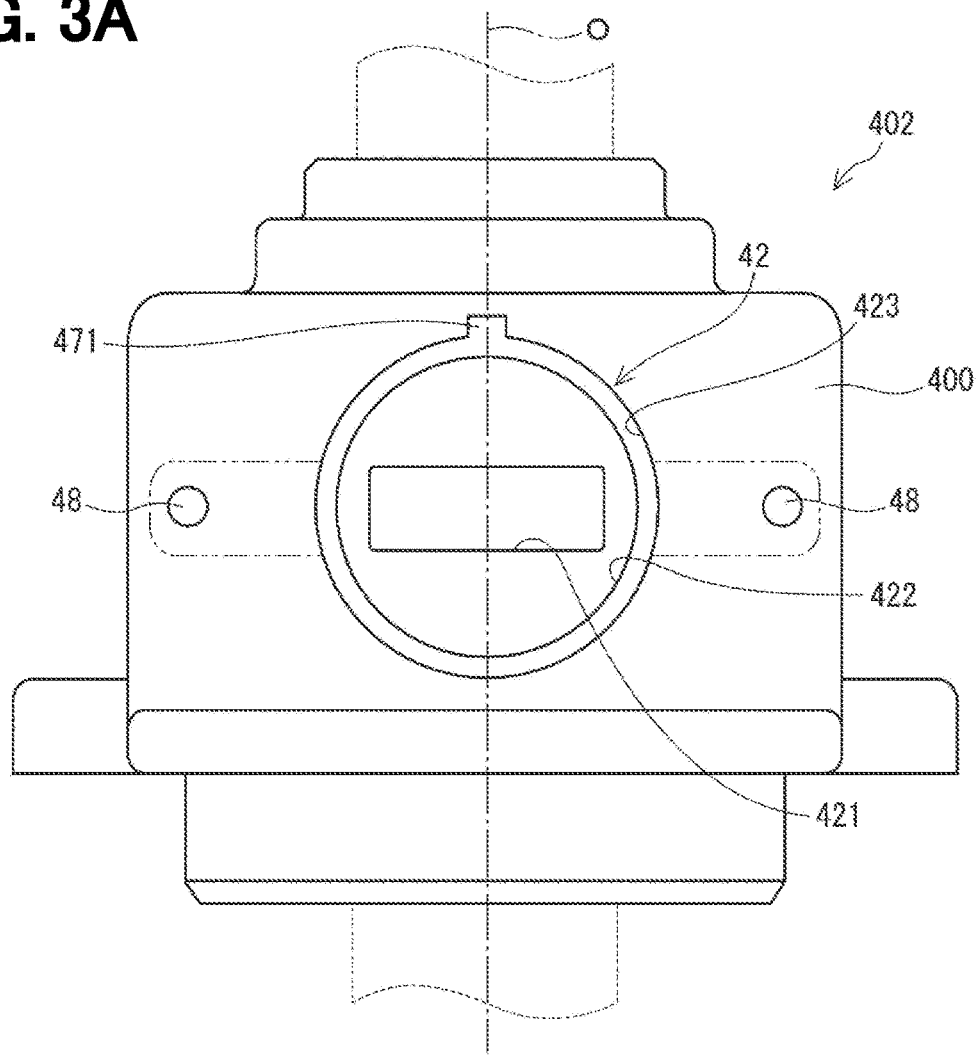
FIG. 3A is a front view of the magnetic detection module mounting portion of a housing in a rack-mounted type (waterproof specification)
Figure 3B:
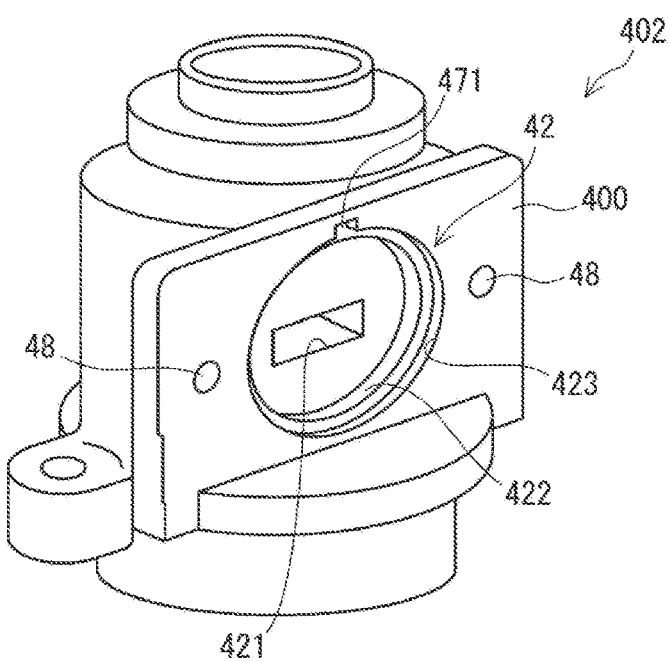
FIG. 3B is a perspective view of FIG. 3A.

Next, a structure for attaching the magnetic detection module 90 to the housing 40 will be described. In the present embodiment, it is assumed that the housing 40 has two specifications in which the shape or size of the mounting portion is different. The housing 401 shown in FIGS. 2A and 2B is a column-mounted type housing provided on the steering shaft of the electric power steering device. The housing 402 shown in FIGS. 3A and 3B is a rack-mounted type housing provided on the rack shaft connecting the pinion gear at the tip of the steering shaft and the wheel.

The rack-mounted type housing 402 is in an environment where rainwater or the like is splashed from the road surface when the vehicle is traveling or the like. Therefore, in order to prevent water from entering the inside of the housing through the gap of the mounting portion, it is necessary to provide a sealing member on the mounting portion. On the other hand, in the column-mounted type housing 401 provided in the vehicle interior, there is no risk of water entering, so it is not necessary to provide a sealing member on the mounting portion.

That is, there are the non-waterproof housing 401 and the waterproof housing 402 depending on the mounting portion of the torque detection device 10 in the vehicle. The housing 401 corresponds to the "housing of the first specification", and the housing 402 corresponds to the "housing of the second specification". In addition, in this specification, "water" in "waterproof" means not only pure water but all liquids which may infiltrate the housing.

Both the housings 401 and 402 have a substantially cylindrical shape with the axis O as the central axis, and have a flat mounting plate 400 formed on a part of the outer periphery thereof. In the description of the housings 401 and 402, the upper side in FIGS. 2A and 3A is referred to as "upper" and the lower side is referred to as "lower" for convenience. The mounting plate 400 has mounting holes 41 and 42 formed across a plane including the central axis O, and fixing holes 48 such as bolts are formed on both sides of the mounting holes 41 and 42 in the circumferential direction. The alternate long and short dash line indicates a portion where a flange 57 shown in FIGS. 7B and 8B abuts, and a fixing hole 48 corresponds to a position of a fixing hole 58 of the flange 57.

As shown in FIGS. 2A and 2B, in the column-mounted type housing 401, the mounting holes 41 are formed in a substantially rectangular shape. One rotation restricting groove 44 is formed in a lower center of the mounting hole 41, and two rotation restricting grooves 45 are formed in the upper portions of both sides of the mounting hole 41. The rotation restricting groove 44 at the lower center is formed relatively shallowly, and the rotation restricting grooves 45 at the upper portions on both sides are formed relatively deeply. The functions of the rotation restricting grooves 44 and 45 will be described later with reference to FIG. 5B.

As shown in FIGS. 3A and 3B, in the rack-mounted type housing 402, the mounting hole 42 includes a substantially rectangular case hole 421 on a back side in a depth direction and a circular seal hole 422 in a middle in the depth direction, and a circular spigot hole 423 on an end face side. Further, in the upper center of the spigot hole 423, one rotation restricting groove 471 is formed continuously with the spigot hole 423. The function of the rotation restricting groove 471 will be described later with reference to FIG. 6B.

It is also possible to manufacture a case dedicated to each of the specifications of the magnetic detection module 90 for the two types of housings 401 and 402 having different shapes and sizes of the mounting portions. However, in that case, two types of resin molding dies are required, and production adjustment and inventory management man-hours for two types of cases are required. Therefore, in the first and second embodiments, it is an object to provide the magnetic detection module that can be selectively mounted on two types of housings 401 and 402 having different specifications by a simple configuration change using common components.

First Embodiment

Subsequently, a specific configuration of the magnetic detection module of the first embodiment will be described. The first embodiment reflects a basic technical idea regarding case sharing. The second embodiment further includes a magnetic shield member that blocks magnetic noise from the outside as compared with the first embodiment. Hereinafter, with respect to the reference numerals of the detection device and the magnetic detection module of each embodiment, the number of the embodiment is assigned to the third digit following "10" and "90". Regarding the reference numerals of the constituent members, in the case of a configuration peculiar to the embodiment, the number of the embodiment is similarly assigned to the third digit, and in the case of substantially the same configuration as the above-described embodiment, the reference numerals of the above-described embodiment are used.

The configurations of the torque detection device 101 and the magnetic detection module 901 of the first embodiment will be described with reference to FIGS. 4 to 8B. The magnetic detection module 901 includes a case assembly 500 and a cap 801. The case assembly 500 includes a case 501, magnetic flux guiding members 601, 602, magnetic sensors 71, 72, a substrate 70, and the like housed in a box portion 51 of the case 501. The magnetic flux guiding members 601 and 602 and the magnetic sensors 71 and 72 are as described above, as shown in FIG. 1. In addition to the magnetic sensors 71 and 72, a sensor signal output circuit and the like are mounted on the substrate 70.

The case 501 is formed of a resin and has a rectangular parallelepiped box portion 51, a connector portion 56 to which a harness for transmitting a signal to an external processing unit is connected, flanges 57 formed with fixing holes 58 for mounting on the housings 401 and 402, and the like. A terminal 73 connected to the substrate 70 is insert-molded between a bottom of the box portion 51 and a bottom of the connector portion 56. The substantially rectangular substrate 70 on which the magnetic sensors 71 and 72 are mounted is installed on the bottom of the box portion 51.

Hereinafter, for convenience of explanation, an opening end 52 side of the box portion 51 is regarded as upper side, and the bottom side of the box portion 51 is regarded as lower side. Further, the side on which the magnetic sensors 71 and 72 of the box portion 51 is mounted is regarded as front side, and the connector portion 56 side is regarded as rear side. An end portion of the case 501 located on the front side with respect to the flange 57 of the box portion 51 forms an insertion portion 53. In the column of "Brief description of the drawing", the view seen from the opening end 52 side is represented as a plan view, and the view viewed from the insertion portion 53 side is represented as a front view. In the following description, "in plan view" is used to mean "when viewed from the opening end 52 side".

Figure 7A:
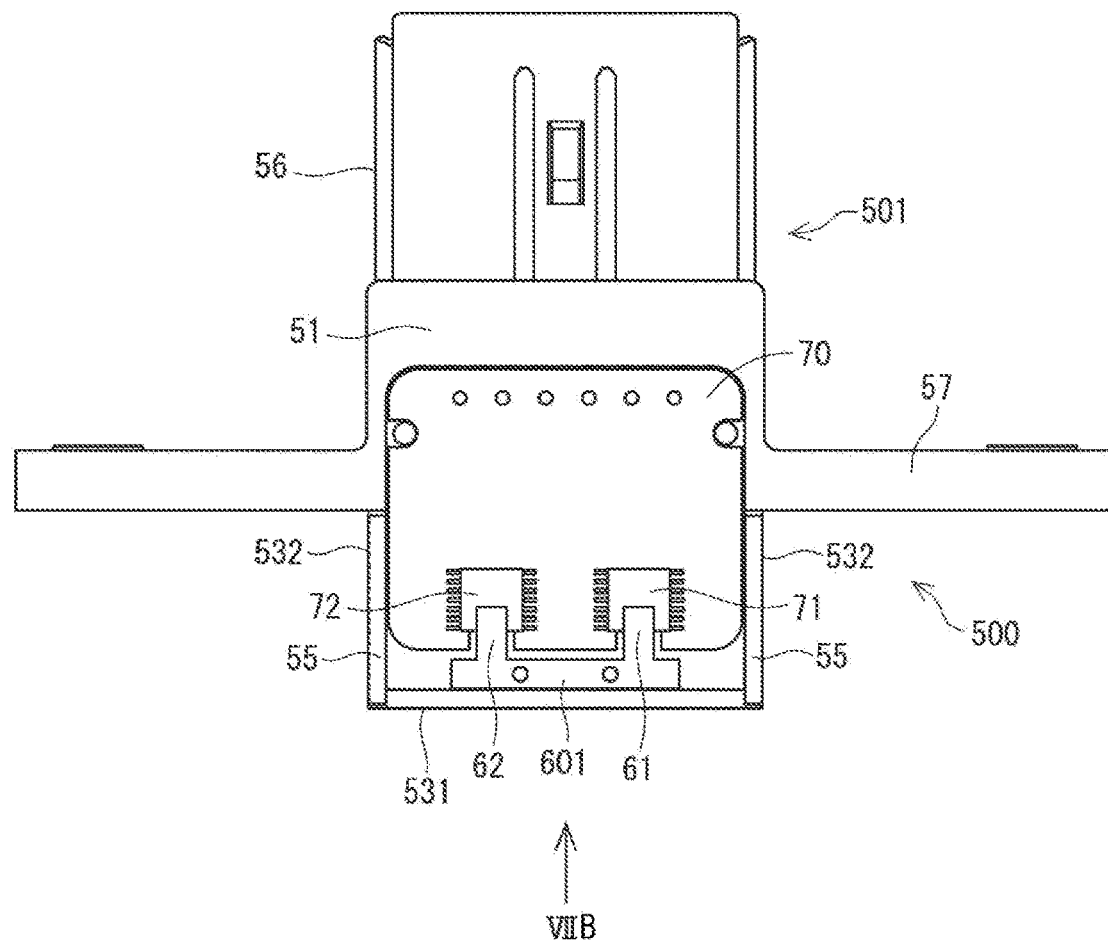
FIG. 7A is a plan view of the case assembly alone.
Figure 7B:
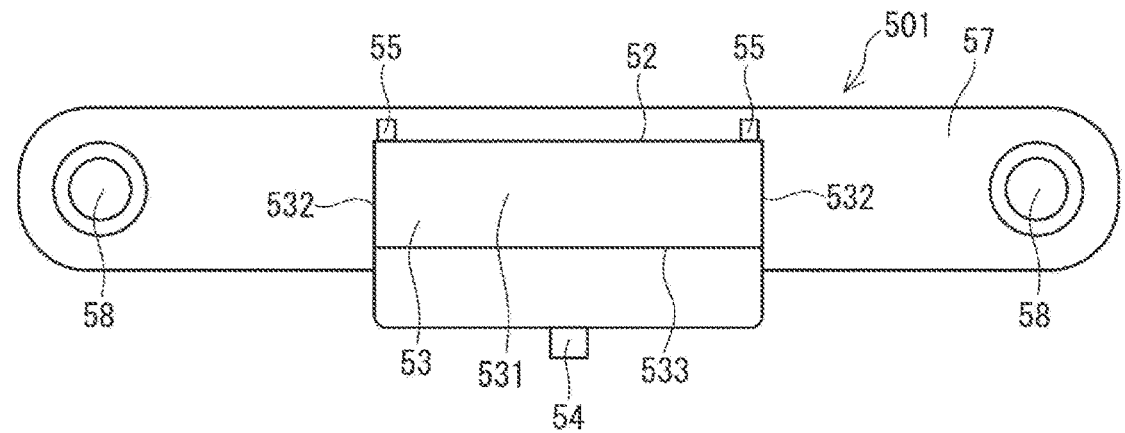
FIG. 7B shows a front surface as seen by an arrow VIIB of FIG. 7A.
Figure 8A:
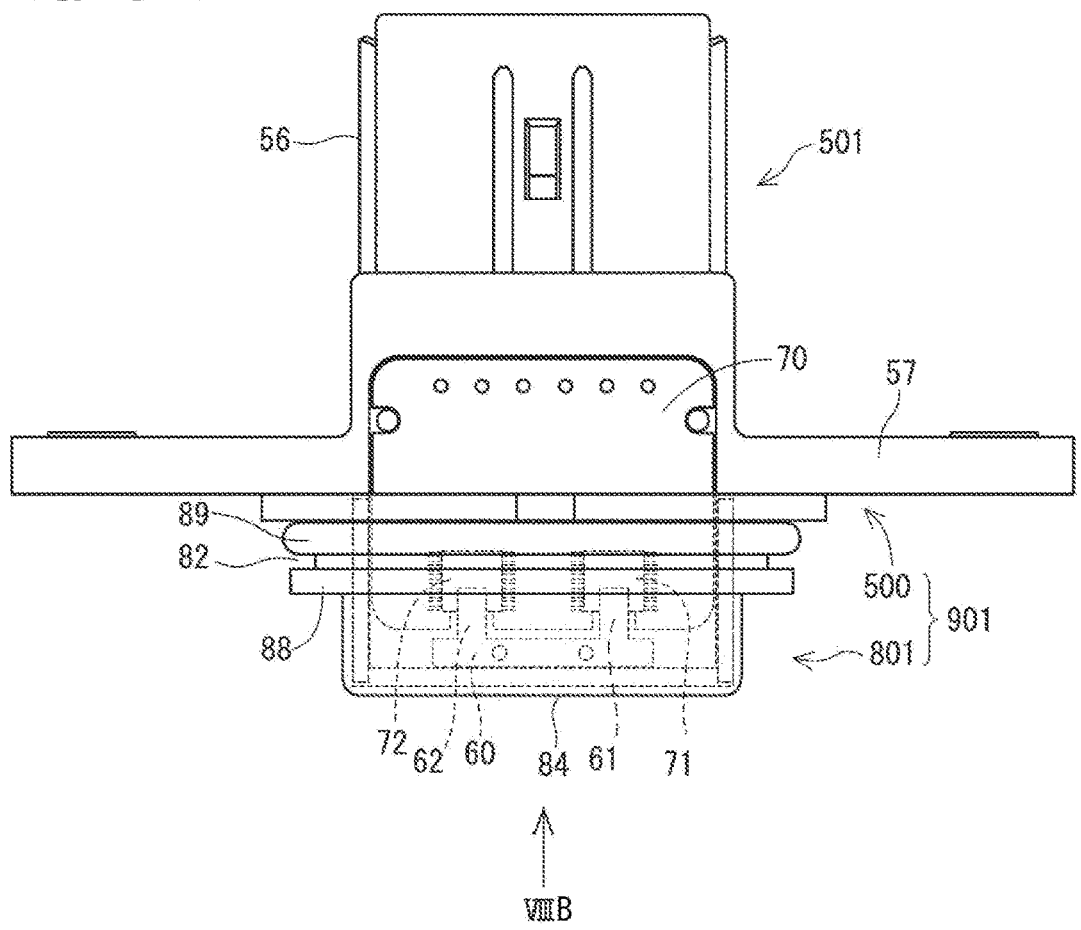
FIG. 8A is a plan view of the case assembly with the cap attached.
Figure 8B:
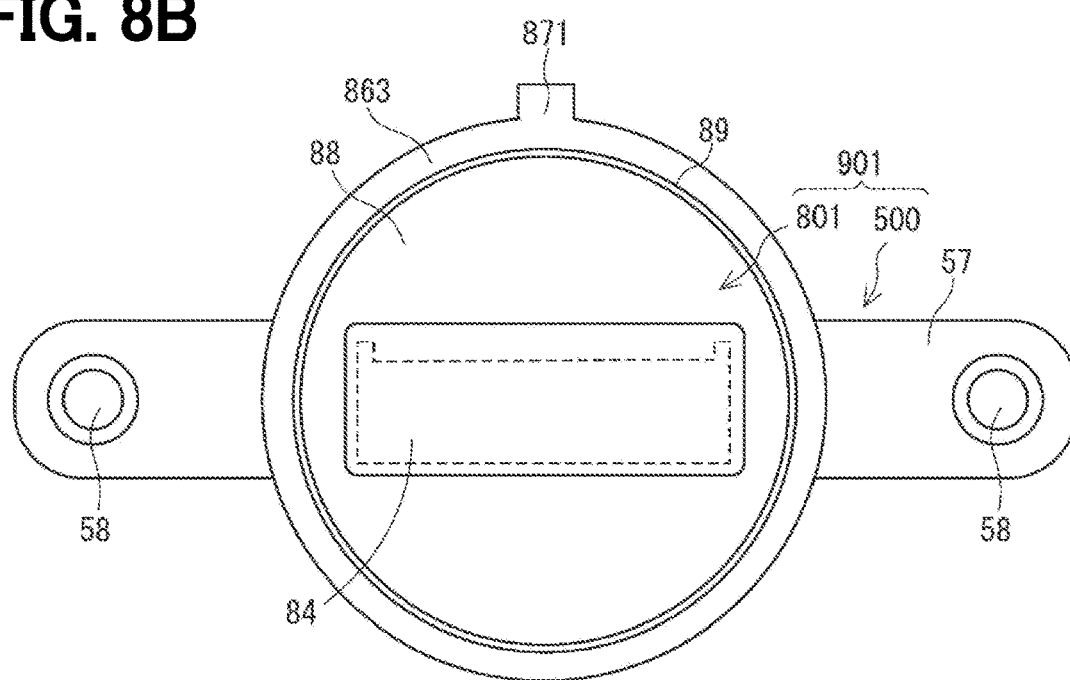
FIG. 8B shows a front surface as seen by an arrow VIIIB of FIG. 8A.

As shown in FIGS. 7A, 7B, etc., the insertion portion 53 has a rectangular parallelepiped shape including a front wall 531, side walls 532, and a bottom wall 533. On the edges of the side walls 532 on both sides on the opening end 52 side, protrusion portions 55 are formed as "misassembling prevention portion" and "rotation regulation portion" that project on the upper side. Further, on the lower surface of the box portion 51, a protrusion portion 54 as a "misassembling prevention portion" and a "rotation regulating portion" projecting on the lower side is provided at the central portion in the left-right direction and near the flange 57 in the front-rear direction.

When the case 501 or the cap 801 is assembled to the housing 40, the "misassembling prevention portion" can be assembled only in a posture located at a predetermined relative angle, and prevents erroneous assembly in a posture located at a position other than the predetermined relative angle. The "rotation regulation portion" regulates rotation with respect to the housing 40 after the case 501 or cap 801 is assembled to the housing 40.

Each of the set of magnetic flux guiding members 601 and 602 has a main body 600 which has a rectangular band shape in a plan view and collects magnetic flux, and two extensions 61 and 62 extending in the orthogonal direction from the main body 600. Each of the extensions 61 and 62 are provided so as to sandwich the magnetic sensors 71 and 72 in the upper-lower direction. In other words, the magnetic sensors 71 and 72 are arranged between the set of magnetic flux guiding members 601 and 602. In the magnetic flux guiding members 601 and 602, at least a part of the main body 600 faces the ring portions 35, 36 of the cylindrical yokes 31 and 32 housed in the housing 40, and the magnetic flux is induced from the magnetic circuit formed in the yokes 31 and 32. Hereinafter, the rectangular band shape of the magnetic flux guiding members 601 and 602 are simply referred to as "straight lines". The detailed configuration and operation of the magnetic flux guiding members 601 and 602 will be described later.

After the magnetic flux guiding embers 601 and 602, the magnetic sensors 71 and 72, and the substrate 70 are housed in the box portion 51 of the case 501, the box portion 51 of the case 501 is potted with molten resin from the opening end 52, and the storage parts are fixed therein. Further, as shown by the broken line in FIG. 6B, a lid 59 that closes the opening end 52 may be used as a separate component. In that case, the upper magnetic flux guiding member 601 can be insert-molded integrally with the lid 59. In another embodiment, the opening end 52 may be closed only by potting the molten resin without using the lid 59, or by using only the lid 59 without potting.

In this way, the case assembly 500 in which the magnetic flux guiding members 601, 602, the magnetic sensors 71, 72, and the substrate 70 are housed in the case 501 is configured. The case assembly 500 can be independently attached to the non-waterproof housing 401. Further, the case assembly 500 can be attached to the waterproof housing 402 with the cap 801 attached to the insertion portion 53. When the case assembly 500 is attached to a non-waterproof housing 401, the case assembly 500 alone constitutes a "magnetic detection module". Although the part to which the cap 801 is attached is the case assembly 500 in the manufacturing process, it can also be expressed as "the cap 801 is attached to the case 501" from the viewpoint of each part.

The cap 801 is formed of resin, and has a receiving hole 83 into which the insertion portion 53 of the case 501 is inserted, and is formed on an end surface of a disc-shaped cap body 811 on the case 501 side. The receiving hole 83 is opened in a rectangular shape corresponding to the shape of the insertion portion 53 of the case 501, and the depth of the receiving hole 83 is deeper than the thickness of the cap body 811. The protrusion accommodating grooves 85 into which the protrusion portion 55 is inserted are formed in the upper portions of both sides of the receiving hole 83. As a result, when the insertion portion 53 is inserted into the receiving hole 83, it is prevented from being inserted in a 180° opposite direction.

On the end face of the cap body 811 opposite to the case 501, a sealing portion 84 that is connected to the end face and covers the bottom of the receiving hole 83 to form a bag is formed. The sealing portion 84 protrudes in a rectangular parallelepiped shape from the cap body 811 on the side opposite to the case 501, and an outer wall thereof is formed to be larger than an inner wall at the bottom of the receiving hole 83 by a predetermined amount. In short, communication is blocked between the outer wall of the sealing portion 84 and the inner wall of the receiving hole 83 so that water does not leak.

On the outer circumference of the cap body 811, an outer flange portion 863 on the opening surface side of the receiving hole 83 and an inner flange portion 88 on the protruding side of the sealing portion 84 are provided in parallel, and an outer peripheral groove 82 is formed between the outer flange portion 863 and the inner flange portion 88. On the upper center of the outer flange portion 863, a protrusion portion 871 protrudes in the outer diameter direction and is formed as a "misassembling prevention portion" and a "rotation regulation portion".

An O-ring 89 as a "sealing member" is attached to the outer peripheral groove 82. At this time, an inner peripheral surface of the O-ring 89 comes into contact with the bottom wall of the outer peripheral groove 82. The O-ring 89 may be mounted on the outer peripheral groove 82 before assembling the cap 801 and the case 501, or may be mounted on the outer peripheral groove 82 after assembling the cap 801 and the case 501.

Figure 5A:
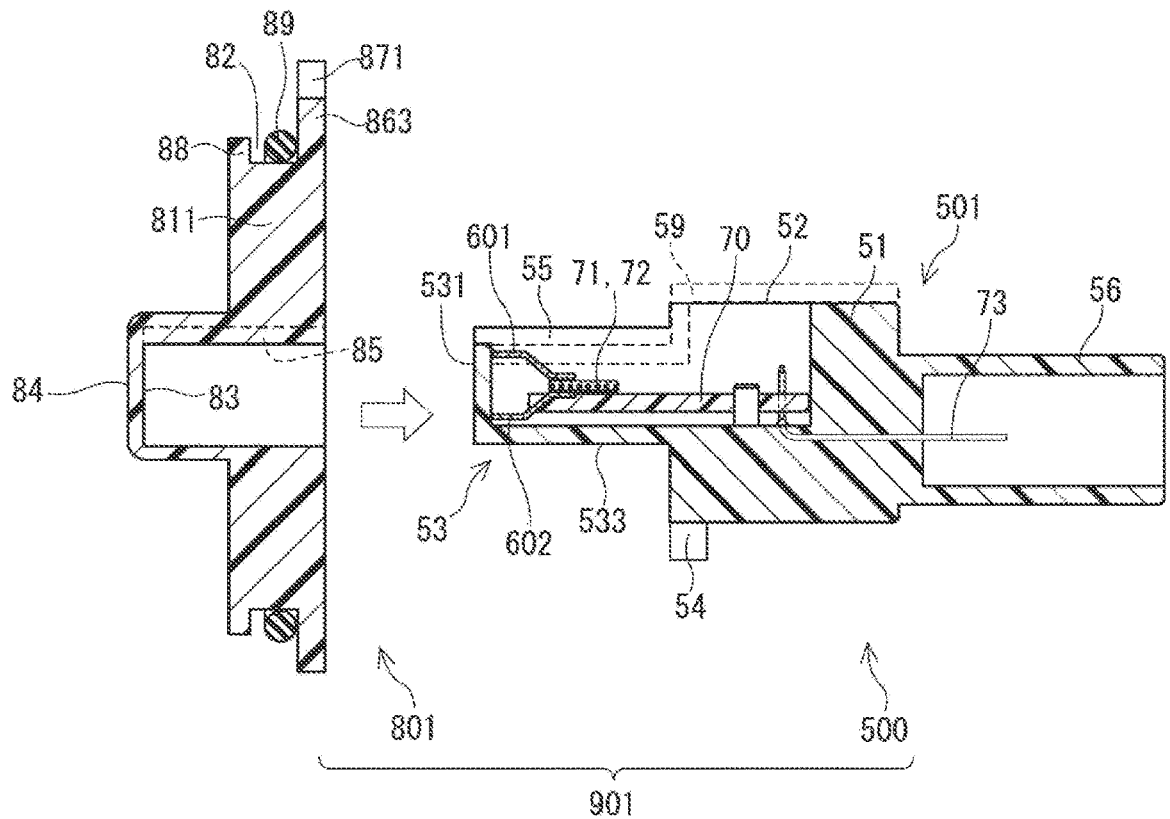
FIG. 5A is a cross-sectional view of a cap and a case assembly.
Figure 5B:
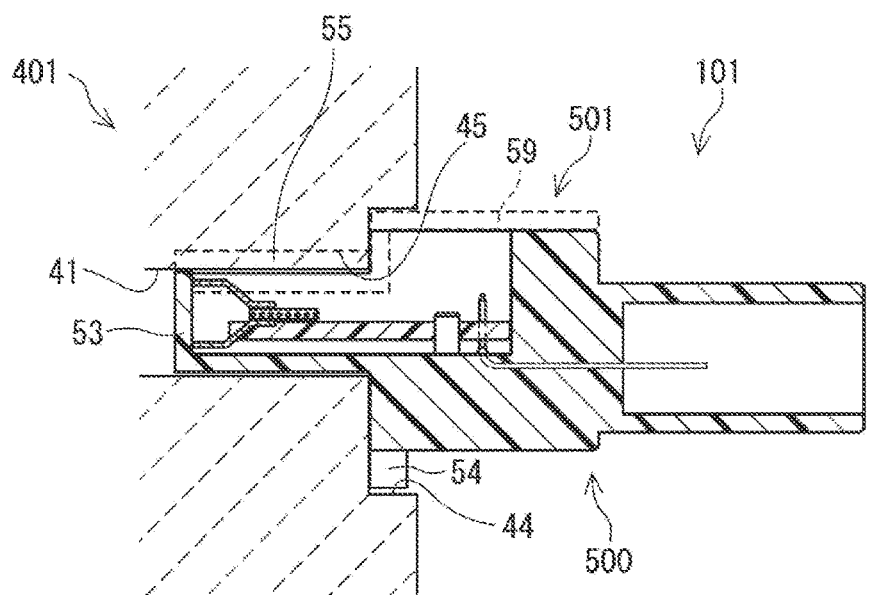
FIG. 5B is a cross-sectional view of a torque detection device which the case assembly is independently mounted in a non-waterproof housing.

FIG. 5B shows a torque detection device 101 in which the case assembly 500 is independently mounted in the mounting hole 41 of the non-waterproof housing 401. The insertion portion 53 of the case 501 is inserted into a substantially rectangular mounting hole 41. At this time, the protrusion 54 on the lower side is inserted into the rotation restricting groove 44, and the protrusion portions 55 on both upper sides are inserted into the rotation restricting groove 45. Therefore, when the case assembly 500 is assembled to the housing 401, it is prevented from being erroneously assembled into the mounting hole 41 in the 180° opposite direction. Further, after being assembled, the rotation of the case assembly 500 with respect to the housing 401 is restricted.

Figure 6A:
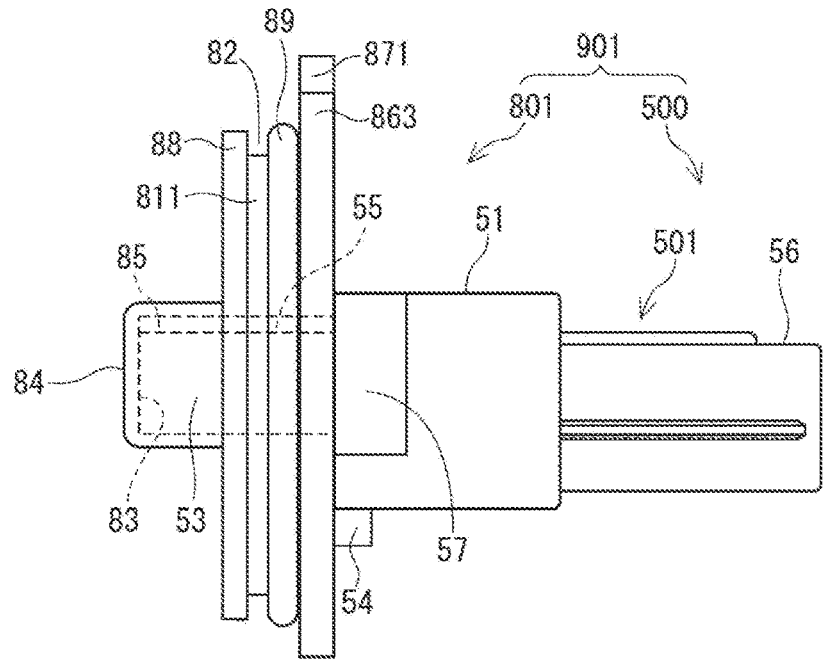
FIG. 6A is a side view of the magnetic detection module with the cap attached to the case assembly.
Figure 6B:
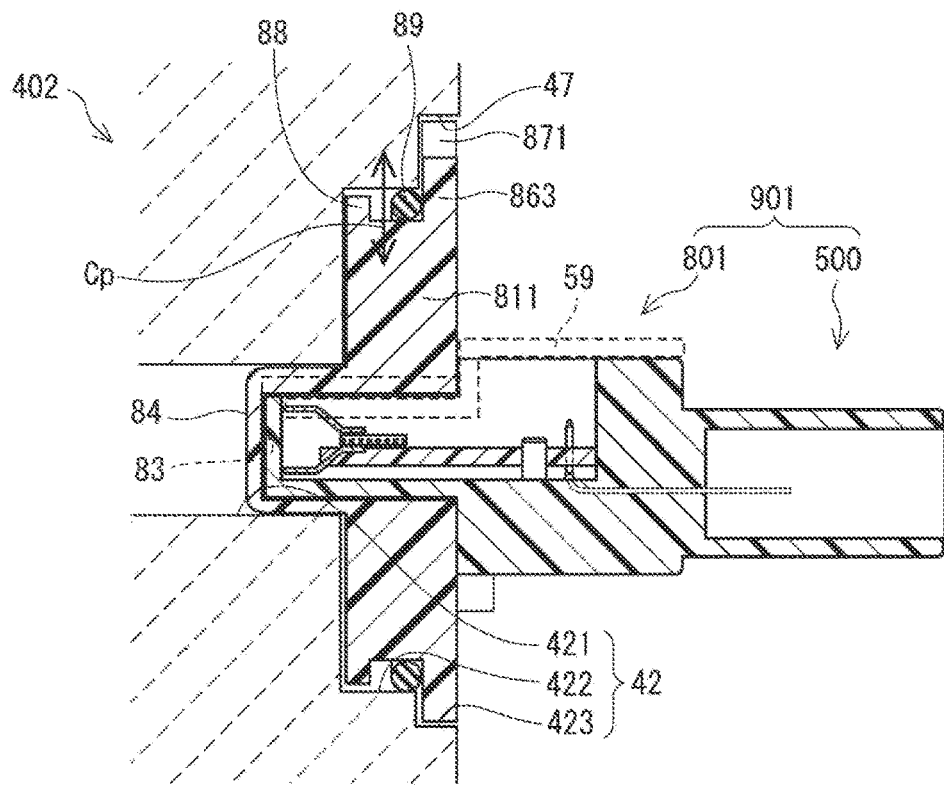
FIG. 6B is a cross-sectional view of a torque detection device in which a case assembly with cap attached is attached to a waterproof housing.

FIG. 6B shows the torque detection device 101 in which the magnetic detection module 901 with the cap 801 attached to the case assembly 500 is attached to the mounting hole 42 of the waterproof housing 402. The sealing portion 84 of the cap 801 is inserted into the substantially rectangular case hole 421, the inner flange portion 88 is inserted into the seal hole 422, and the outer flange portion 863 is inserted into the spigot hole 423. At this time, by inserting the protrusion portion 871 into the rotation restricting groove 471, when the magnetic detection module 901 is assembled to the housing 402, it is prevented from being erroneously assembled to the mounting hole 42 in the 180° opposite direction. Further, after being assembled, the rotation of the magnetic detection module 901 with respect to the housing 402 is restricted.

The outer peripheral surface of the O-ring 89 is pressed against the inner wall of the seal hole 422 while being attached to the mounting hole 42. Therefore, as indicated by a bidirectional arrow Cp, the O-ring 89 is radially compressed and used for a shaft seal. Compared to face seal, shaft seal is less susceptible to dimensional variations in seal-related parts and tilt during assembly, and has excellent sealing function.

Figure 9A:
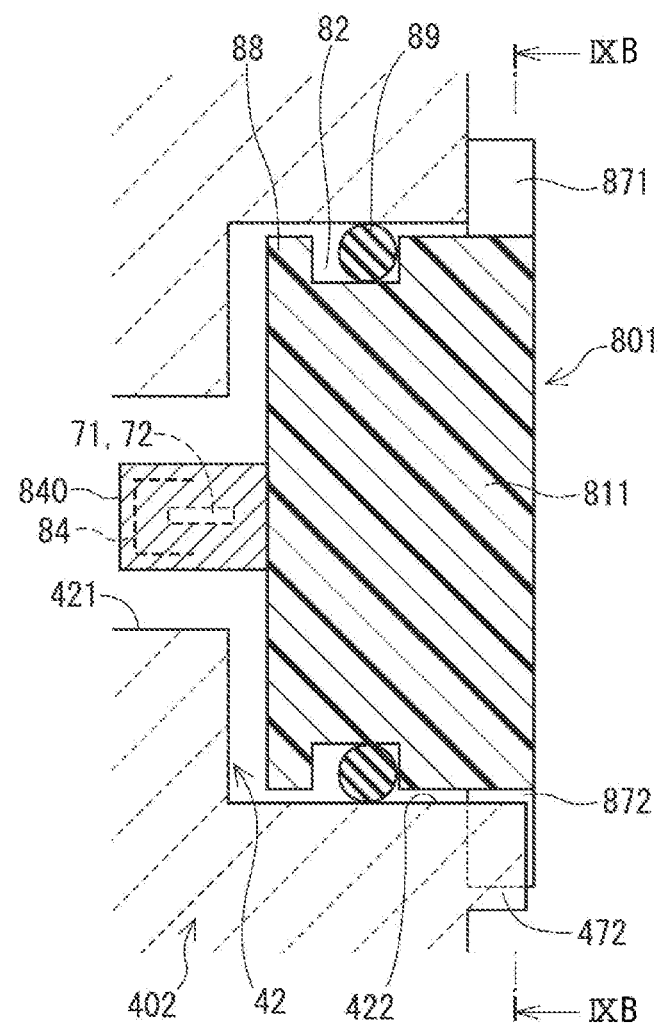
FIG. 9A is a schematic cross-sectional view of a torque detection device in which a cap is attached to a housing according to a first modification of the first embodiment.
Figure 10:
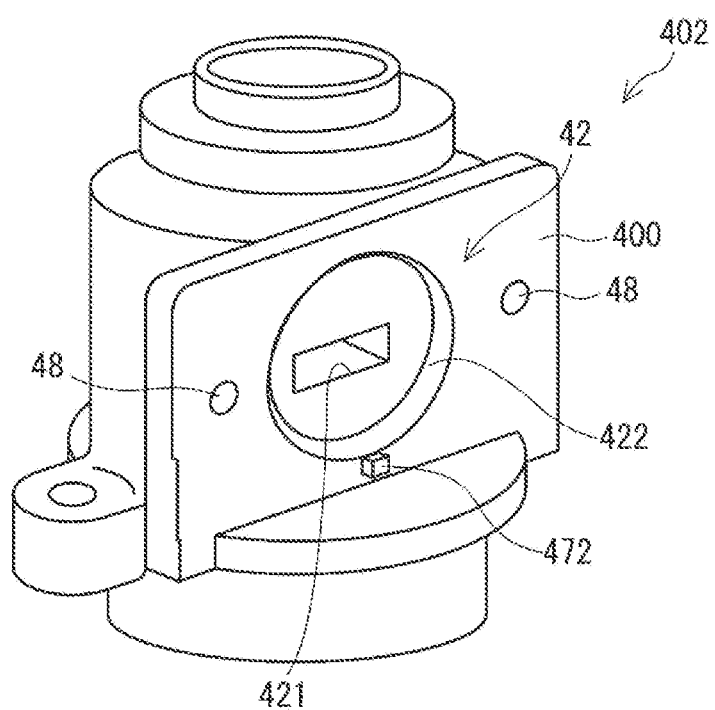
FIG. 10 is a perspective view of a mounting hole of the housing to which the cap of FIG. 9A is attached.
Figure 11A:
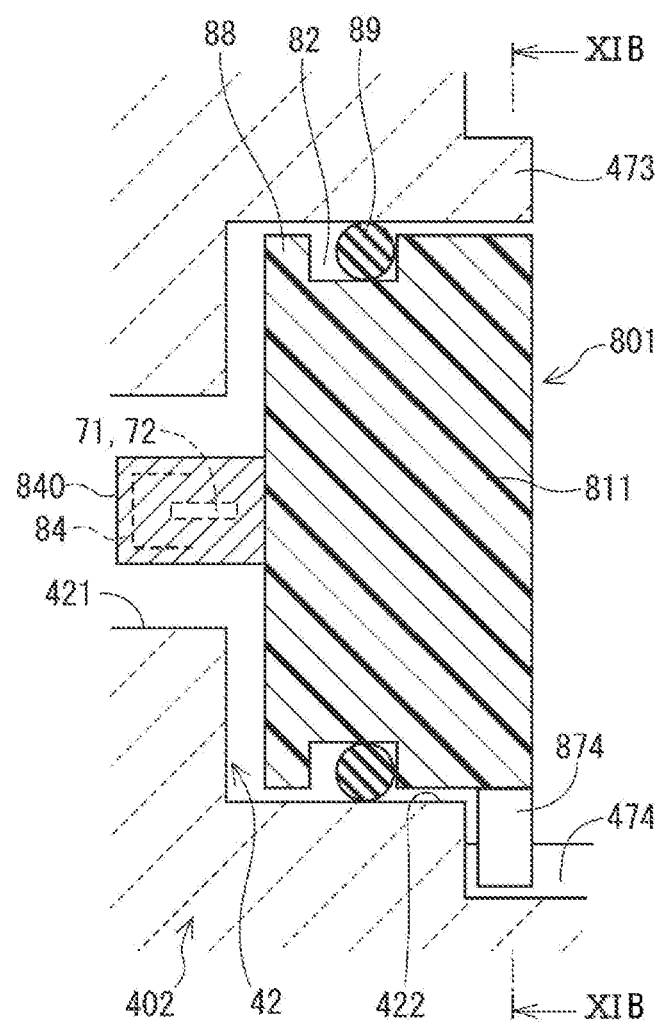
FIG. 11A is a schematic cross-sectional view of a torque detection device in which a cap according to a second modification of the first embodiment is attached to a housing.

Next, with reference to FIGS. 9A to 12, a modified example of the first embodiment in which the configurations of the "misassembling prevention portion" and the "rotation regulation portion" in the mounting of the cap 801 and the housing 402 are different will be described. FIGS. 9A and 11A are schematic cross-sectional views showing a state in which the cap 801 is attached to the housing 402. The schematic cross-sectional view shows a schematic cross-sectional view in which the cap 801 and the case 501 are combined, and an accurate illustration of the internal structure as shown in FIG. 6B is omitted. Further, a prismatic portion covered with the bag portion 84 protruding from a tip surface of the cap body 811 is referred to as "sensor unit 840". The magnetic sensors 71 and 72 are housed in the sensor unit 840. Here, "being housed" includes a configuration "being molded".

Figure 9B:
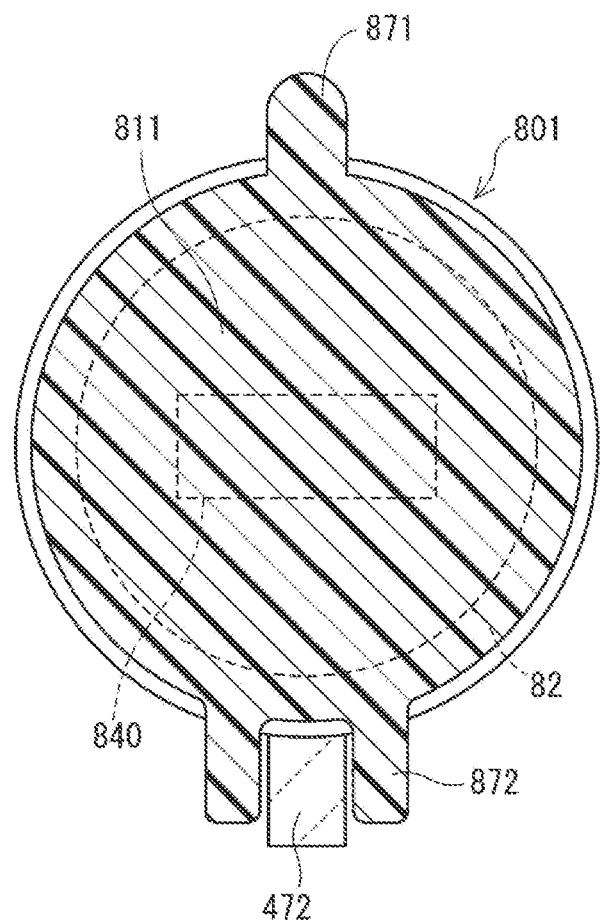
FIG. 9B is a cross-sectional view taken along line IXB-IXB of FIG. 9A.
Figure 11B:
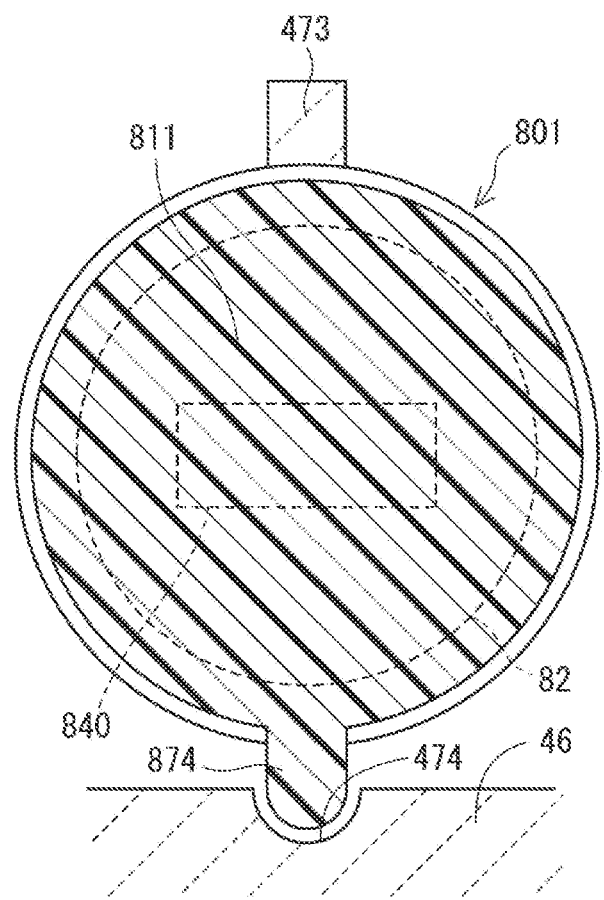
FIG. 11B is a cross-sectional view taken along line XIB-XIB of FIG. 11A.
Figure 12:
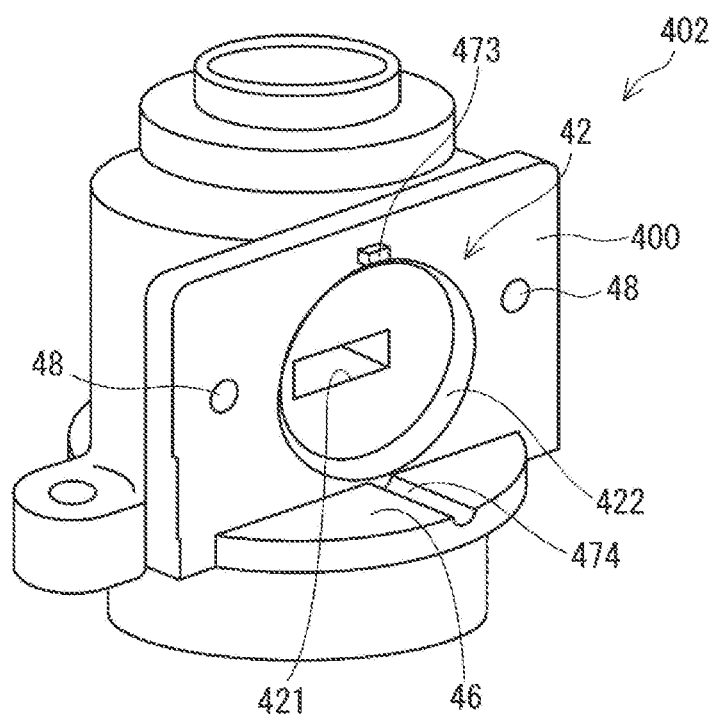
FIG. 12 is a perspective view of a mounting hole of the housing to which the cap of FIG. 11A is attached.

FIGS. 9B and 11B are radial cross-sectional views showing a "misassembling prevention portion" and a "rotation regulation portion" provided on the cap 801 or the housing 402 on the base end side of the cap 801. FIGS. 10 and 12 are perspective views of the mounting hole 42 of the housing 402 corresponding to FIG. 3B.

Figure 4:
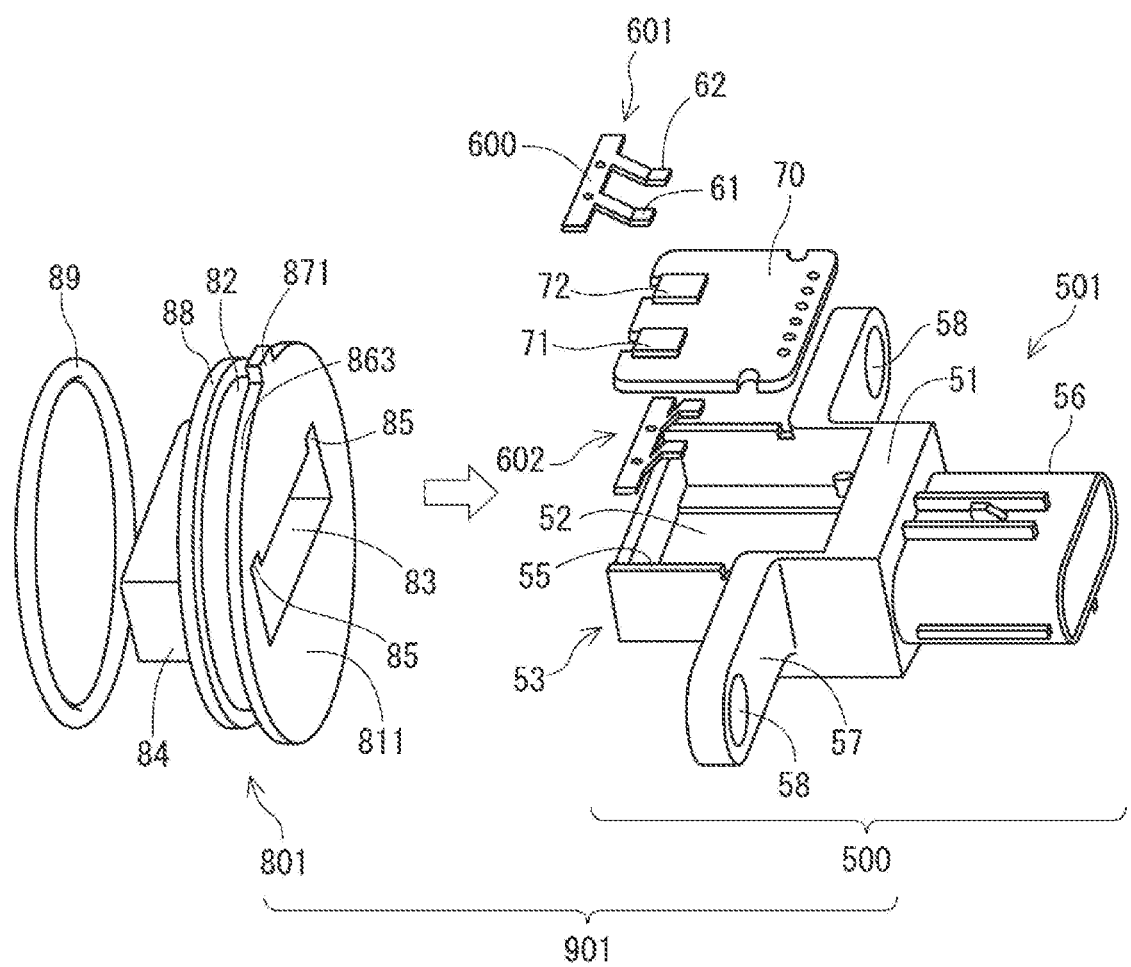
FIG. 4 is an exploded perspective view of the magnetic detection module according to a first embodiment.

In the first modification shown in FIGS. 9A to 10, a protrusion portion 871 similar to that in FIG. 4 is formed on the upper part of the cap body 811 and a pair of twin protrusion portions 872 are formed at the lower part of the cap body 811 so as to project substantially parallel to the outer diameter at predetermined intervals. On the end surface of the housing 402, a rotation regulation convex portion 472 interposed between the twin protrusion portions 872 is formed. On the other hand, the portion of the end face of the housing 402 facing the protrusion portion 871 is a flat end face without unevenness.

By assembling the cap 801 to the housing 402 at the rotation position where the twin protrusion portions 872 interpose the rotation regulation convex portion 472, the twin protrusion portion 872 functions as a "rotation regulation portion". Further, when assembling the cap 801 to the housing 402, if the position in the rotation direction is erroneously assembled by 180°, the protrusion portion 871 interferes with the rotation regulation convex portion 472 of the housing 402, so that the protrusion portion 871 functions as "misassembling prevention portion". As described above, in the first modification, each of the protrusion portion 871 and the twin protrusion portions 872 of the cap body 811 shares the functions of the "misassembling prevention portion" and the "rotation regulation portion" by utilizing the rotation regulation convex portion 472 of the housing 402.

In a second modification shown in FIGS. 11A to 12, a protrusion portion 874 projecting in the outer diameter direction is formed in a lower portion of the cap body 811. An upper part of the cap body 811 is a simple cylindrical surface without unevenness. The housing 402 is formed with a rotation restricting groove 474 in which the tip of the protrusion portion 874 engages with the pedestal portion 46 below the mounting hole 42. Further, an interference protrusion portion 473 is formed at the edge portion of the mounting hole 42 on the side opposite to the rotation restricting groove 474.

By assembling the cap 801 to the housing 402 at the rotation position where the tip of the protrusion portion 874 engages with the rotation restricting groove 474, the protrusion portion 874 functions as a "rotation regulation portion". Further, when assembling the cap 801 to the housing 402, if the position in the rotation direction is erroneously assembled by 180°, the protrusion portion 871 interferes with the interference protrusion portion 473 of the housing 402, so that the protrusion portion 874 functions as "misassembling prevention portion". As described above, in the second modification, the protrusion portion 874 of the cap body 811 functions as an "misassembling prevention portion" by utilizing the interference protrusion portion 473 of the housing 402, and functions as a "rotation control portion" by utilizing the rotation restricting groove 474 of the housing 402.

Figure 13A:
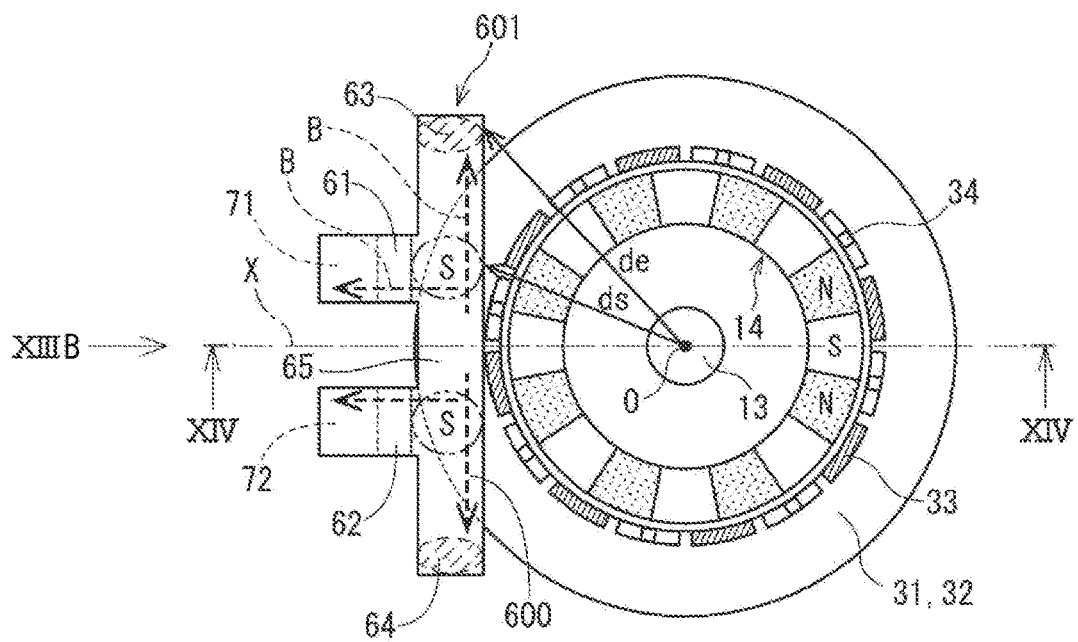
FIG. 13A is a plan view illustrating a magnetic transmission action between a yoke and a magnetic flux guiding member when the magnetic detection module is attached to the housing.

Next, the configurations of the magnetic flux guiding members 601 and 602 of the present embodiment will be described with reference to FIGS. 13A to 14. FIGS. 13A to 14 are three views of a plan view, a side view, and an axial sectional view, in which a magnetic flux transmission action showing the magnetic flux transmission action between the yokes 31 and 32, the magnetic flux guiding members 601 and 602 and the magnetic sensors 71 and 72 is shown with the case assembly 500 attached to the housing. The plan view means a view seen from the first axis 11 side in the axial direction, and the side view means a view seen from the radial direction.

Strictly speaking, the "plan view" is a radial cross-sectional view in which the multipolar magnet 14 and the claws 33 and 34 of the yokes 31 and 32 are cut at the upper part of the upper magnetic flux guiding member 601, and it is referred to as a "plan view" form the viewpoint of the magnetic flux guiding member 601. Further, although the ring is actually visible only in the lower yoke 32 in the radial cross-sectional view, the reference numerals are given as "31, 32" including the upper yoke 31 for convenience of explanation.

In the plan view of FIG. 13A, a "reference line X" extending in the left-right direction through the central axis O is described. The reference line X is defined as a virtual straight line connecting the intermediate positions of the two magnetic sensors 71 and 72 and the central axis O. In other words, the two magnetic sensors 71, 72 are arranged symmetrically with respect to the reference line X. In the embodiment of one magnetic sensor, the reference line X is defined as a virtual straight line connecting the magnetic sensor and the central axis O.

Figure 13B:
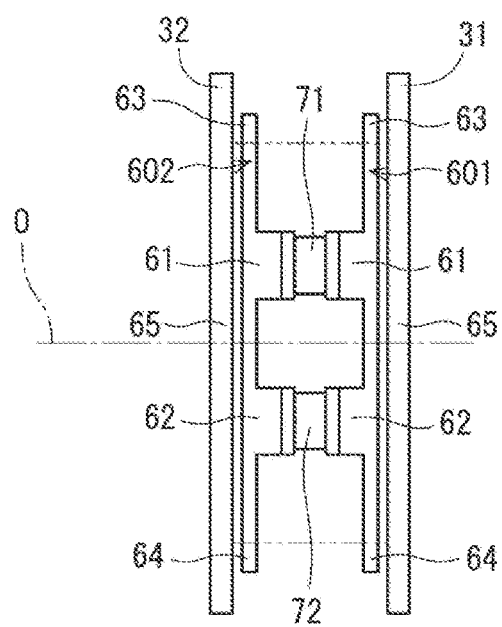
FIG. 13B is a side view as seen by arrow XIIIB of FIG. 13A.
Figure 14:
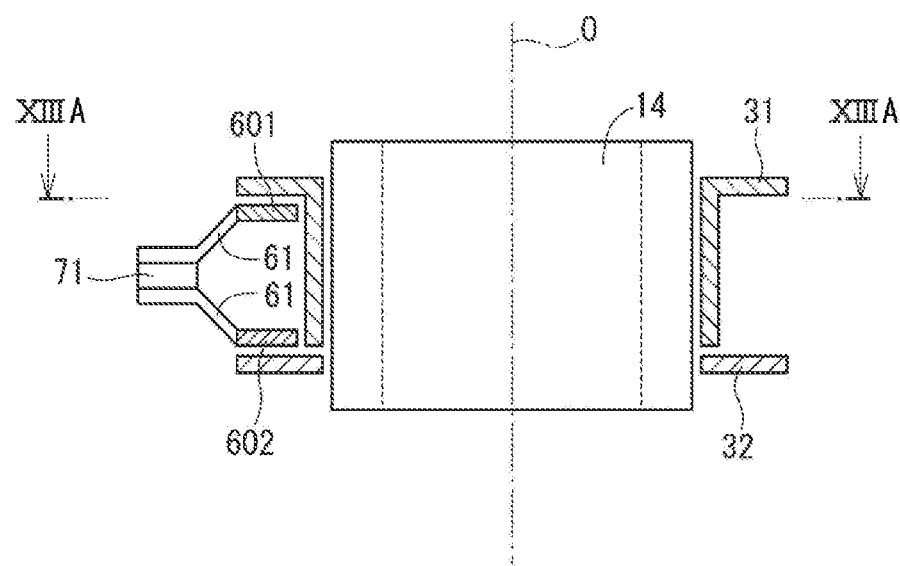
FIG. 14 is an axial sectional view taken along line XIV-XIV of FIG. 13A.

The side view of FIG. 13B is a view of the magnetic sensors 71 and 72 viewed from the outside in the radial direction along the reference line X. The alternate long and short dash line indicates an outer shape of the claws 33 and 34. In the side view of FIG. 13B, the torsion bar 13 and the multipolar magnet 14 are not shown. The axial sectional view of FIG. 14 is a cross-sectional view on a plane including the central axis O and the reference line X. In the axial sectional view, the torsion bar 13 is not shown, and the multipolar magnet 14 shows only the outline.

In the present embodiment, in a plan view, the main bodies of the magnetic flux guiding members 601 and 602 are formed in a rectangular band shape symmetrical with respect to the reference line X, that is, in a straight line shape. The longitudinal sides of the magnetic flux guiding members 601 and 602 are straight lines orthogonal to the reference line X.

The magnetic flux guiding members 601, 602 have the extensions 61 and 62 extending radially outward from the main body 600, and the "branch portion of the main body 600 to the extensions 61 and 62" is referred to as a S portion. The "branch portion to the extensions 61 and 62" substantially means the vicinity of the magnetic sensors 71 and 72. The "S portion" is the same symbol as the S pole of the multipolar magnet 14, but the distinction between them is obvious and there is no risk of confusion. Portions of each of the main bodies 600 of the magnetic flux guiding members 601 and 602 corresponding to ends of the yokes 31 and 32 in the circumferential direction across the reference line X within a range where the main bodies 600 face the yokes 31 and 32 are defined as "circumferential end portions 63 and 64 of the main body 600" and hatched with broken lines in the drawing. A distance ds from the S portion to the central axis O is shorter than the distance de from the circumferential end portions 63 and 64 to the central axis O.

In the side view and axial-direction sectional view, each of the magnetic flux guiding members 601 and 602 faces a surface of the ring portion of the corresponding one of the yokes 31 and 32 from inside of the yokes 31 and 32 in the axial direction with a constant gap. The area where each of the magnetic flux guiding members 601 and 602 faces the surface of the ring portion of the corresponding one of the yokes 31 and 32 (the area hereinafter referred to as the "facing area") is relatively large at a corresponding intermediate portion 65 that is close to the magnetic sensors 71 and 72, and becomes smaller at locations closer to the corresponding circumferential end portions 63 and 64. The S portions, which are locations from which the extensions 61 and 62 are branched, have larger facing areas than do the circumferential end portions 63 and 64, thus having greater magnetic permeance per unit area between each of the magnetic flux guiding members 601 and 602 and the corresponding one of the yokes 31 and 32. Here, "per unit area" is significant in that, when magnetic permeance is compared between different locations, the wording explicitly states that the areas of the locations are the same. In the description of the embodiments provided below where the wording "per unit area" is omitted, it is to be understood that "magnetic permeance" means "magnetic permeance per unit area."

The magnetic sensor 71 is disposed between the extensions 61, and the magnetic sensor 72 is disposed between the extensions 62. The extensions 61 are each bent to have a step in the axial direction so as to have a minimum gap therebetween in a location where the magnetic sensor 71 is placed. The extensions 62 are each bent to have a step in the axial direction so as to have a minimum gap therebetween in a location where the magnetic sensor 72 is placed.

Figure 15:
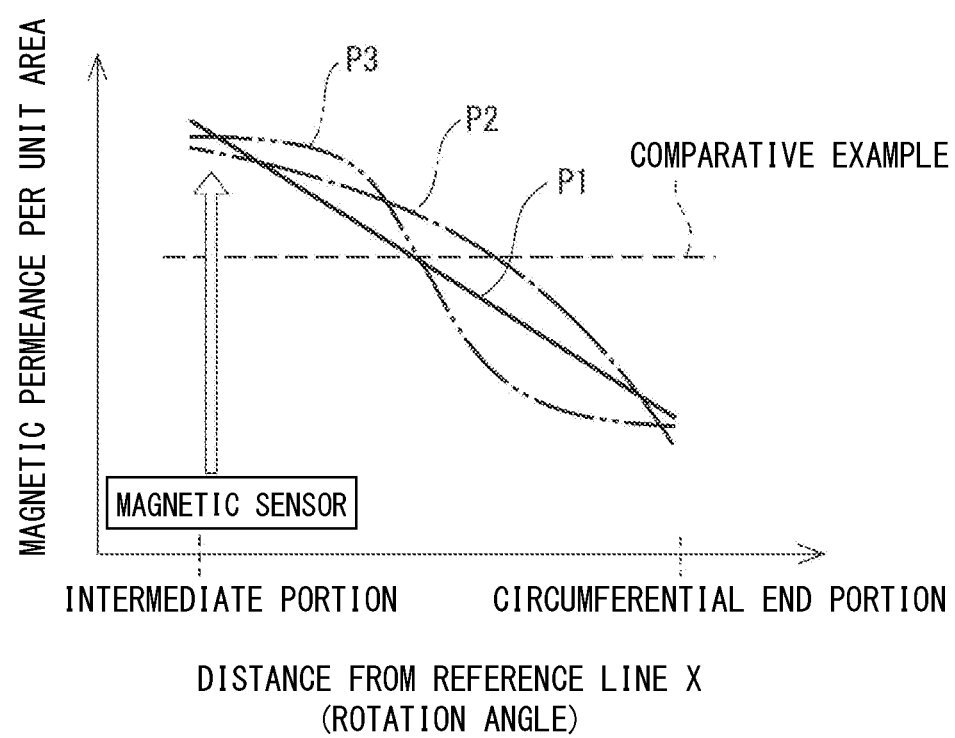
FIG. 15 is a correlation diagram between a distance from a reference line and a magnetic permeance.

Next, with reference to FIG. 15, the reason why the signal becomes large due to the above mentioned configuration will be described. FIG. 15 shows a correlation diagram between the distance from the reference line X or the rotation angle and the magnetic permeance for the magnetic permeance between the magnetic flux guiding members 601, 602 and the yokes 31 and 32. The magnetic permeance P is represented by the formula (1) using a magnetic permeability p of the material, a facing area A, and a gap length L.

$$P = \mu(A/L) \quad (1)$$

Here, assuming that the magnetic flux guiding members 601 and 602 are formed of a single soft magnetic material, the larger the facing area A between the magnetic flux guiding members 601 and 602 and the yokes 31 and 32, or a shorter gap length L, results in greater magnetic permeance P. In the present embodiment, the gap between the magnetic flux guiding members 601 and 602 and the yokes 31 and 32 is constant, but the facing area becomes smaller from the intermediate portion 65 toward the circumferential end portions 63 and 64, so that the magnetic permeance of the intermediate portion 65 is larger than the magnetic permeance of the circumferential end portions 63 and 64. In FIG. 15, the correlation characteristic may be any characteristic such as a straight line like P1, a simple curve without an inflection point like P2, an S-shaped curve like P3, or a stepped polygonal line.

The magnetic sensors 71 and 72 are arranged in the extensions 61 and 62 branched from the main body 600 near the intermediate portion 65, and the branch portion of the magnetic flux guiding members 601 and 602 to the extensions 61 and 62 in the main body 600 substantially means "vicinity of the magnetic sensors 71 and 72". The magnetic flux guiding members 601, 602 are configured that the "magnetic permeance per unit area between the magnetic flux guiding members 601, 602 and the yokes 31 and 32" at the branch portion to the extensions 61 and 62 is larger than that at the circumferential end portions 63 and 64. As a result, the signals of the magnetic sensors 71 and 72 can be increased.

Figure 16:
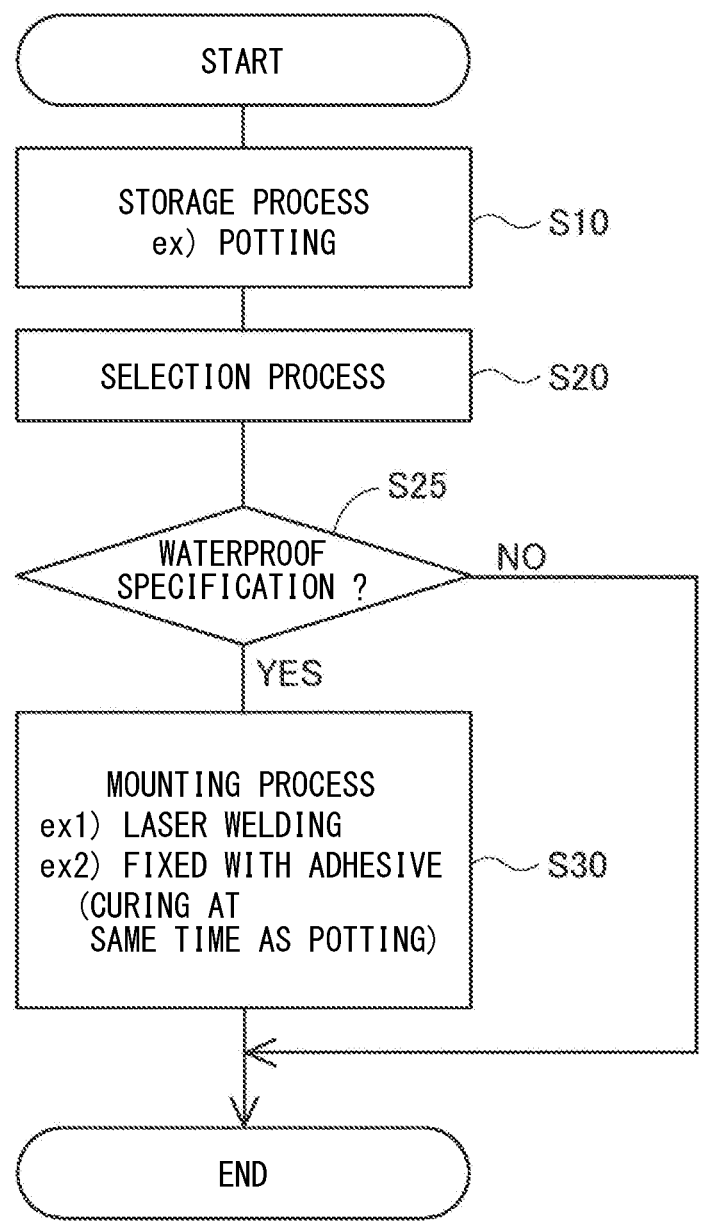
FIG. 16 is a flowchart of a production method for a magnetic detection module.

Next, a method of manufacturing the magnetic detection module will be described with reference to the flowchart of FIG. 16. In the description of the flowchart, the symbol S represents a "step". In a storage process of S10, the magnetic flux guiding members 601, 602, the magnetic sensors 71, 72, the substrate 70, and the like are housed in the box portion 51 of the case 501. Then, for example, the molten resin is potted in the remaining space of the box portion 51, and the magnetic sensors 71 and 72 are fixed. Further, the box portion 51 may be covered with a lid 59. In this way, the case assembly 500 is manufactured in the storage process S10.

In a selection process of S20, according to the specifications of the housing to be attached, it is selected whether to use the case assembly 500 alone or to attach a cap 801 set for each housing specification to the end of the case 501. In the first embodiment, it is determined whether the case assembly 500 is attached to the non-waterproof housing 401 that does not require the sealing member or the waterproof housing 402 that requires the sealing member.

In S25, the selection result is determined. When the case assembly 500 is attached to the waterproof housing 402, it is determined as YES in S25, and the process proceeds to the attachment process of S30. When the case assembly 500 is attached to the non-waterproof housing 401, it is determined as NO in S25, and the process ends. In this case, the case assembly 500 is used alone without the cap 801 being attached.

In a mounting process of S30, the cap 801 is mounted and fixed to the case 501. In the configuration of the first embodiment, the insertion portion 53 formed at the end of the case 501 is inserted into the receiving hole 83 formed in the cap 801. After that, a joint portion between the insertion portion 53 of the case 501 and the receiving hole 83 of the cap 801 is welded by laser welding or the like. Here, even in a configuration in which the sealing portion 84 that covers the bottom of the receiving hole 83 to form a bag as shown in FIGS. 4 to 8B is not provided, the joint portion surrounding the magnetic sensors 71 and 72 is welded all around. Therefore, water leakage from the bottom of the receiving hole 83 can be prevented.

The cap 801 may be fixed with an adhesive in the mounting process. When the molten resin is potted in the storage step, it is preferable that the potting is cured and the adhesive is cured at the same time. As a result, the cycle time can be shortened.

As described above, the magnetic detection module 901 of the first embodiment can change the mounting specifications to the housing 40 depending on the presence or absence of the cap 801. Specifically, for the waterproof housing 402, a magnetic detection module in which the cap 801 provided with the sealing member 89 is attached to the case 501 is supplied. Further, for the non-waterproof housing 401, the case assembly 501 without the cap 801 is independently supplied as a magnetic detection module. Therefore, for example, when the case 501 is manufactured by resin molding, only one type of mold is required for the case 501, and inventory management is simplified.

Second Embodiment

Next, with reference to FIGS. 17A to 18B, a magnetic detection module 902 of the second embodiment provided with the magnetic shield member will be described. The magnetic shield member is made of a soft magnetic material such as iron or permalloy, and blocks magnetic noise from the outside.

Figure 17A:
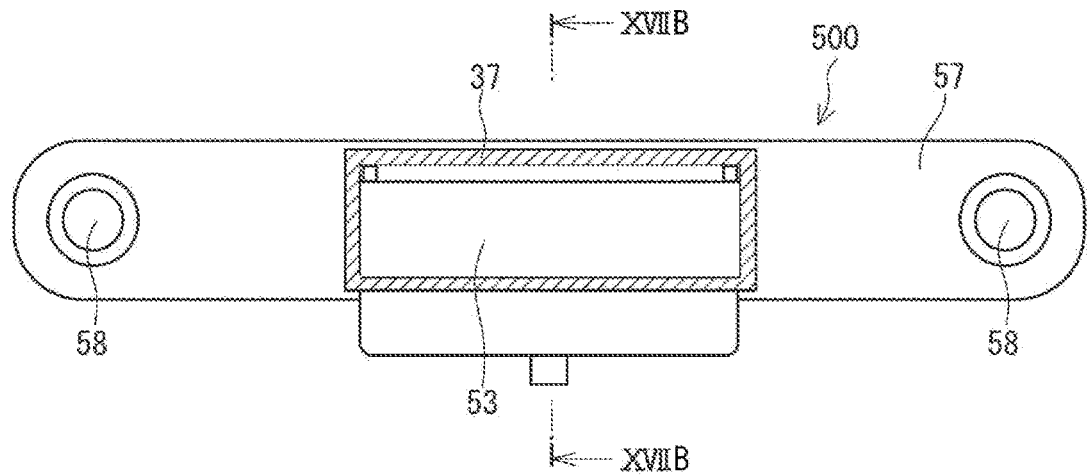
FIG. 17A is a plan view of the case assembly unit of a second embodiment in which the case is provided with the magnetic shield member.
Figure 17B:
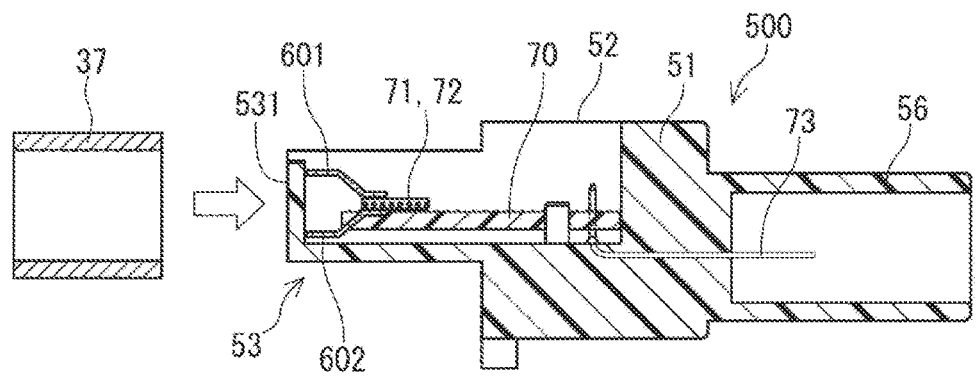
FIG. 17B shows a cross-sectional view taken along line XVIIB-XVIIB of FIG. 17A of the magnetic shield member and the case assembly.
Figure 17C:
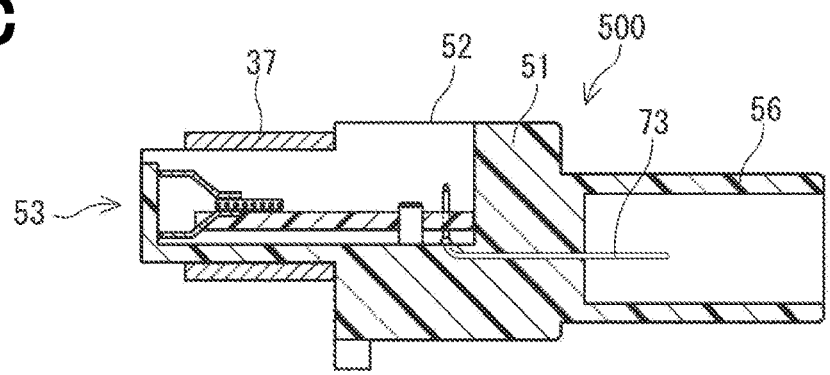
FIG. 17C shows a cross-sectional view of the case assembly provided with the magnetic shield member.

In the form shown in FIGS. 17A to 17C, a rectangular frame-shaped magnetic shield member 37 is provided at the insertion portion 53 of the case assembly 500 that is independently attached to the non-waterproof housing 401. Specifically, after the molten resin is potted on the case 501, the magnetic shield member 37 is covered so as to surround the magnetic sensors 71 and 72 from all sides. Therefore, the magnetic noise directed to the magnetic sensors 71 and 72 is effectively blocked.

Figure 18A:
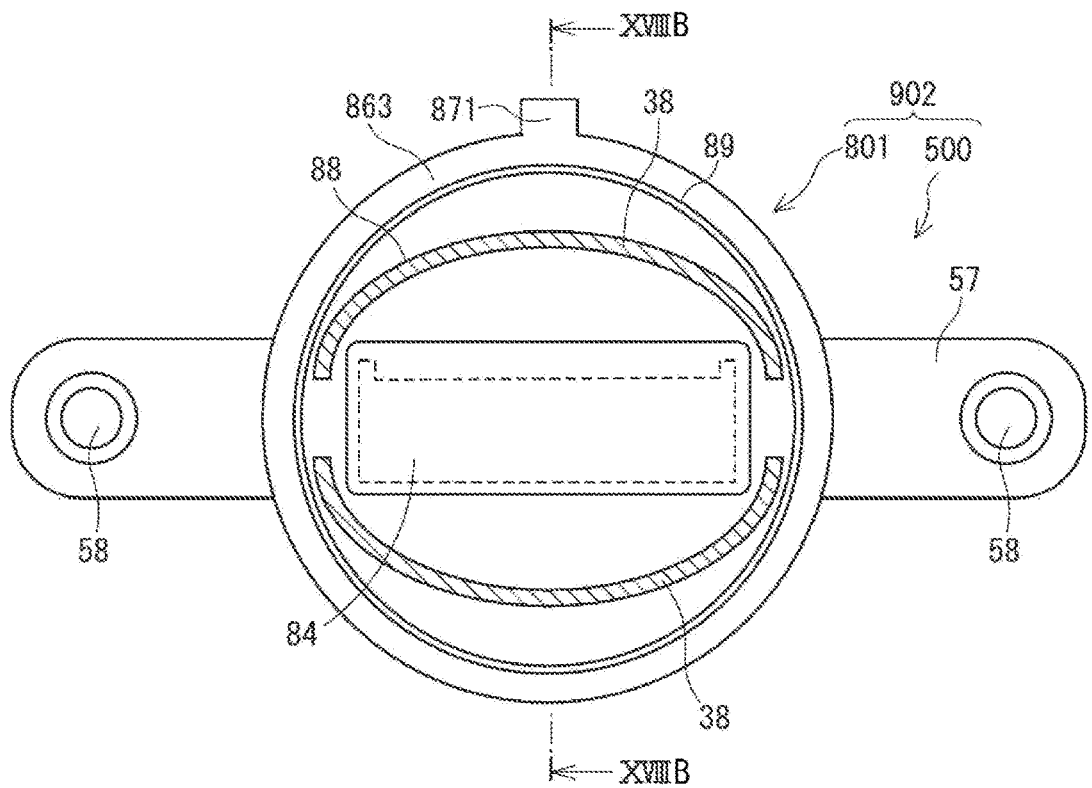
FIG. 18A is a plan view of the magnetic detection module of the second embodiment in which the cap is provided with the magnetic shield member.
Figure 18B:
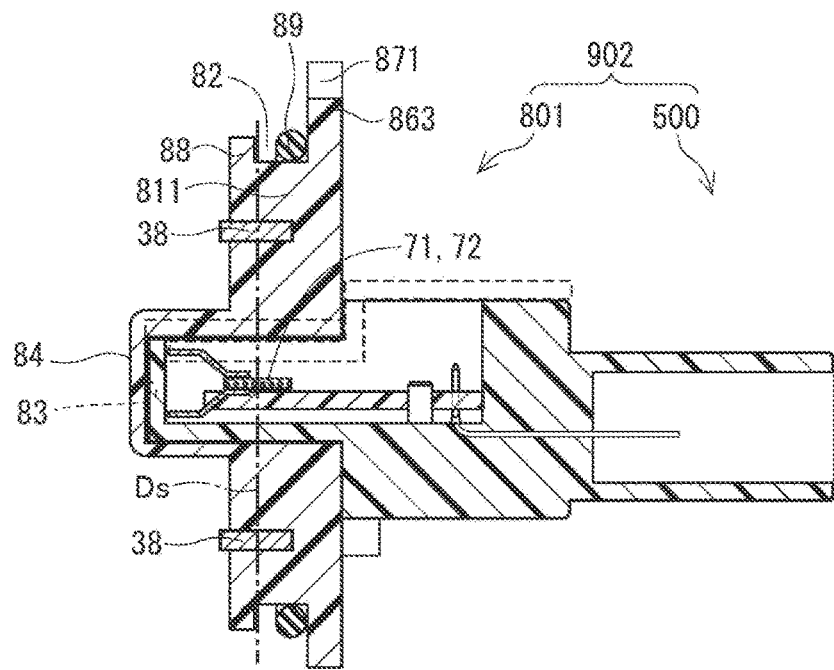
FIG. 18B is a cross-sectional view taken along the line XVIIIB-XVIIIB of FIG. 18A.

In the form shown in FIGS. 18A and 18B, a pair of arch-shaped magnetic shield members 38 are provided on the cap 801 of the magnetic detection module 902 attached to the waterproof housing 402. The pair of magnetic shield members 38 are provided so as to surround the sealing portion 84 from the upper-lower direction. As shown in FIG. 18B, the magnetic shield member 38 is arranged so that a center line Ds in the depth direction overlaps the magnetic sensors 71 and 72. Therefore, the magnetic noise directed to the magnetic sensors 71 and 72 is effectively blocked.

Third Embodiment

Figure 19:
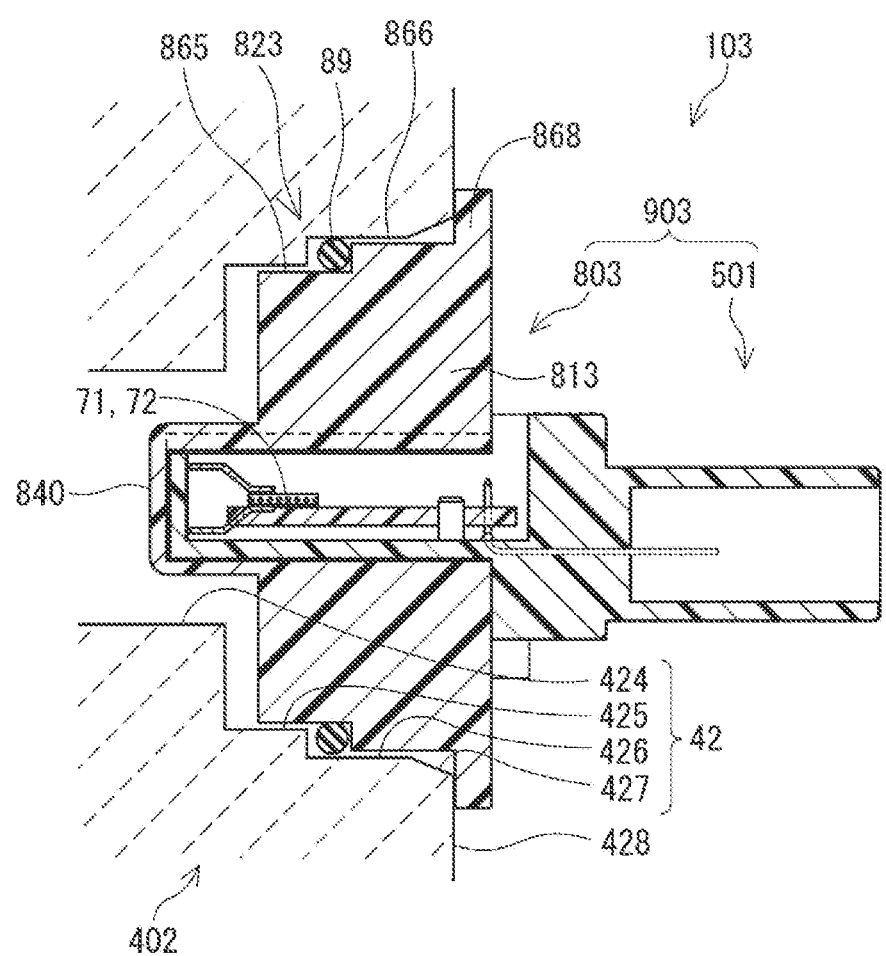
FIG. 19 is a cross-sectional view of a torque detection device in which a magnetic detection module according to a third embodiment is attached to a housing.

Next, a third embodiment will be described with reference to FIG. 19. A torque detection device 103 of the third embodiment includes a housing 402 having a mounting hole 42 whose inner wall is cylindrical, and a magnetic detection module 903 mounted in the mounting hole 42. Although not shown in FIG. 19, a set of yokes 31 and 32 for transmitting magnetic flux generated according to the magnitude of torque is provided inside the housing 402. The magnetic detection module 903 detects the magnetic flux transmitted from the yokes 31 and 32 with one or more magnetic sensors 71 and 72.

Similar to the first embodiment, the magnetic detection module 903 of the third embodiment has a disc-shaped cap 803 attached to the tip of the case 501. An outer peripheral surface of the cap body 813 in the cap 803 faces the inner wall of the mounting hole 42. However, in the cap 801 of the first embodiment, the outer peripheral groove 82 is formed between the outer flange portion 863 and the inner flange portion 88. On the other hand, the cap 803 of the third embodiment is not provided with an inner flange portion, and a step portion 823 in the radial direction is formed on the outer periphery. In the example of FIG. 19, the O-ring 89 as a sealing member for the shaft seal is attached to the step portion 823, but in other embodiments, the O-ring 89 may not be provided. The step portion 823 is composed of a step between a large diameter portion 866 on the base end side of the cap body 813 and a small diameter portion 865 on the tip end side thereof. The large diameter portion 866 and the small diameter portion 865 correspond to the "large shaft portion" and the "small shaft portion".

The mounting hole 42 has a case hole 424, a small diameter hole 425, a large diameter hole 426, and a chamfered portion 427 in order from the back with respect to the end surface 428 side. The large diameter hole 426 and the small diameter hole 425 correspond to the "large hole" and the "small hole". The large diameter portion 866 of the cap 803 is inserted into the large diameter hole 426, and the small diameter portion 865 is inserted into the small diameter hole 425. On the base end side of the large diameter portion 866, a flange portion 868 that abuts on an end surface 428 of the housing 402 is formed. Further, the sensor unit 840 projects from the tip surface of the cap body 813. The tip of the sensor unit 840 is inserted between the ring portions 35, 36 of the set of yokes 31, 32.

In the torque detection device 103 of the third embodiment, the dimensional relationship of the fitting gap between the large diameter portion 866 and the large diameter hole 426 or the small diameter portion 865 and the small diameter hole 425 and the gap between the sensor unit 840 and the ring portion of the yoke is adjusted appropriately. Since the configuration and the effect regarding the dimensional relationship are the same as the configuration and the effect of the torque detection device 104 of the following fourth embodiment, they will be described together in the fourth embodiment.

Fourth Embodiment

Figure 20:
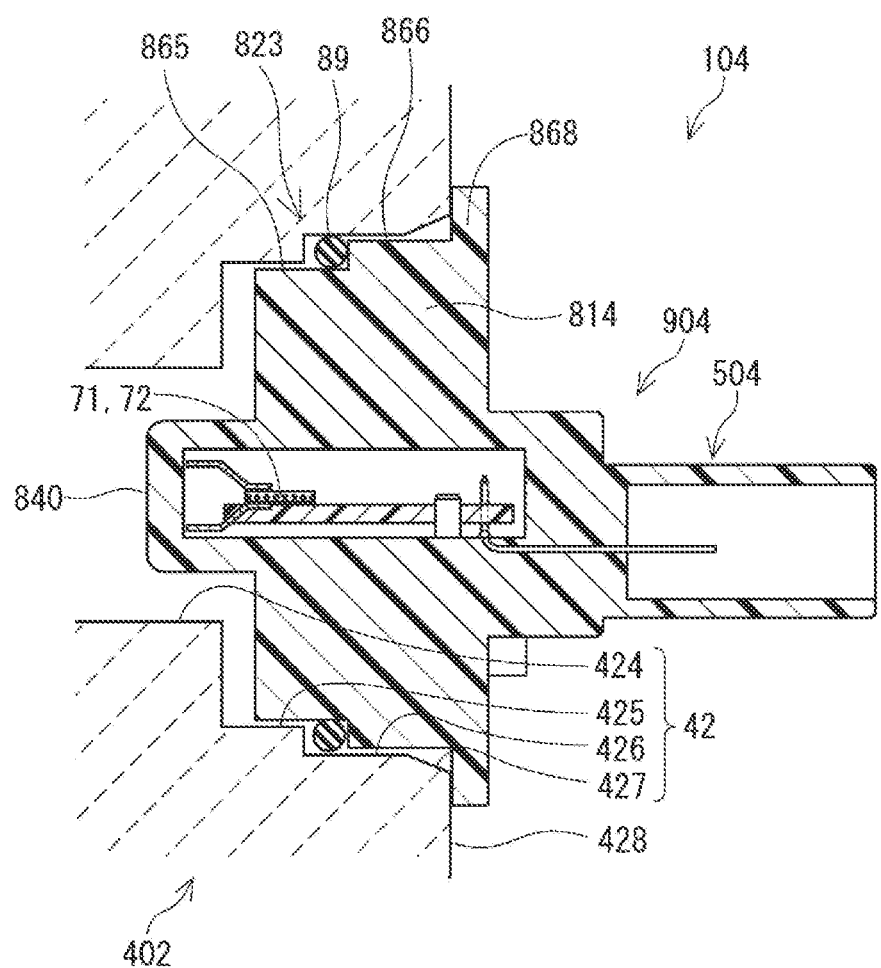
FIG. 20 is a cross-sectional view of a torque detection device in which a magnetic detection module according to a fourth embodiment is attached to a housing.

Next, a fourth embodiment will be described with reference to FIG. 20. A torque detection device 104 of the third embodiment includes the housing 402 having the mounting hole 42 whose inner wall is cylindrical, and a magnetic detection module 904 mounted in the mounting hole 42. Similar to the third embodiment, a set of yokes 31 and 32 for transmitting magnetic flux generated according to the magnitude of torque is provided inside the housing 402. The magnetic detection module 904 detects the magnetic flux transmitted from the yokes 31 and 32 with one or more magnetic sensors 71 and 72.

The magnetic detection module 904 is not intended to be selectively mountable to a plurality of housings, and the mounting target is limited to the housing 402 having a mounting hole 42 whose inner wall is cylindrical. The fourth embodiment aims to prevent interference between the sensor unit 840 and the member on the housing 402 side when the magnetic detection module 904 is inserted into the housing 402. Therefore, the magnetic detection module 904 of the fourth embodiment is not configured to have a cap of another member attached to the end portion of the case, but is configured by an integrated case 504. The case 504 is integrally formed of resin in a shape equivalent to the state in which the cap 803 is attached to the case 501 in the third embodiment shown in FIG. 19. That is, the one in which the case 501 and the cap 803 are combined is the integrated case 504 of the fourth embodiment.

A portion corresponding to the cap body 813 of the cap 803 of the third embodiment is referred to as a "cylindrical portion 814" in the fourth embodiment. The cylindrical portion 814 corresponds to the "cylindrical portion" and faces the inner wall of the mounting hole 42. Further, the sensor unit 840 projects from the tip surface of the cylindrical portion 814. In other words, the form in which the cylindrical portion 814 of the case 504 of the fourth embodiment is composed of the cap body 813 of the cap 803 of another member corresponds to the third embodiment. In short, the form in which the O-ring 89 is mounted in the third embodiment has both purposes, "selective mounting to a plurality of housings of waterproof and non-waterproof specifications" and "prevention of interference between the magnetic sensor and the housing side member".

Therefore, the configuration of the cylindrical portion 814 and the mounting hole 42 facing the cylindrical portion 814 of the fourth embodiment is substantially the same as the configuration of the cap main body 813 and the mounting hole 42 facing the outer peripheral surface of the cap main body 813 of the third embodiment. The mounting hole 42 has a large-diameter hole 426 formed on the opening side and a small diameter hole 425 formed at the back of the large-diameter hole 426.

The cylindrical portion 814 has a flange portion 868 that abuts on the end surface 428 of the housing from the base end side toward the tip end side where the magnetic sensors 71 and 72 are arranged, a large diameter portion 866 that is inserted into the large diameter hole 426, and a small diameter portion 865 that is inserted into the small diameter hole 425. In the example of FIG. 20, the O-ring 89 is attached to the outer periphery of the small diameter portion 865 as a sealing member, but in other embodiments, the O-ring 89 may not be provided. The O-ring 89 is used for a shaft seal with respect to the inner wall of the small diameter hole 425.

Figure 21:
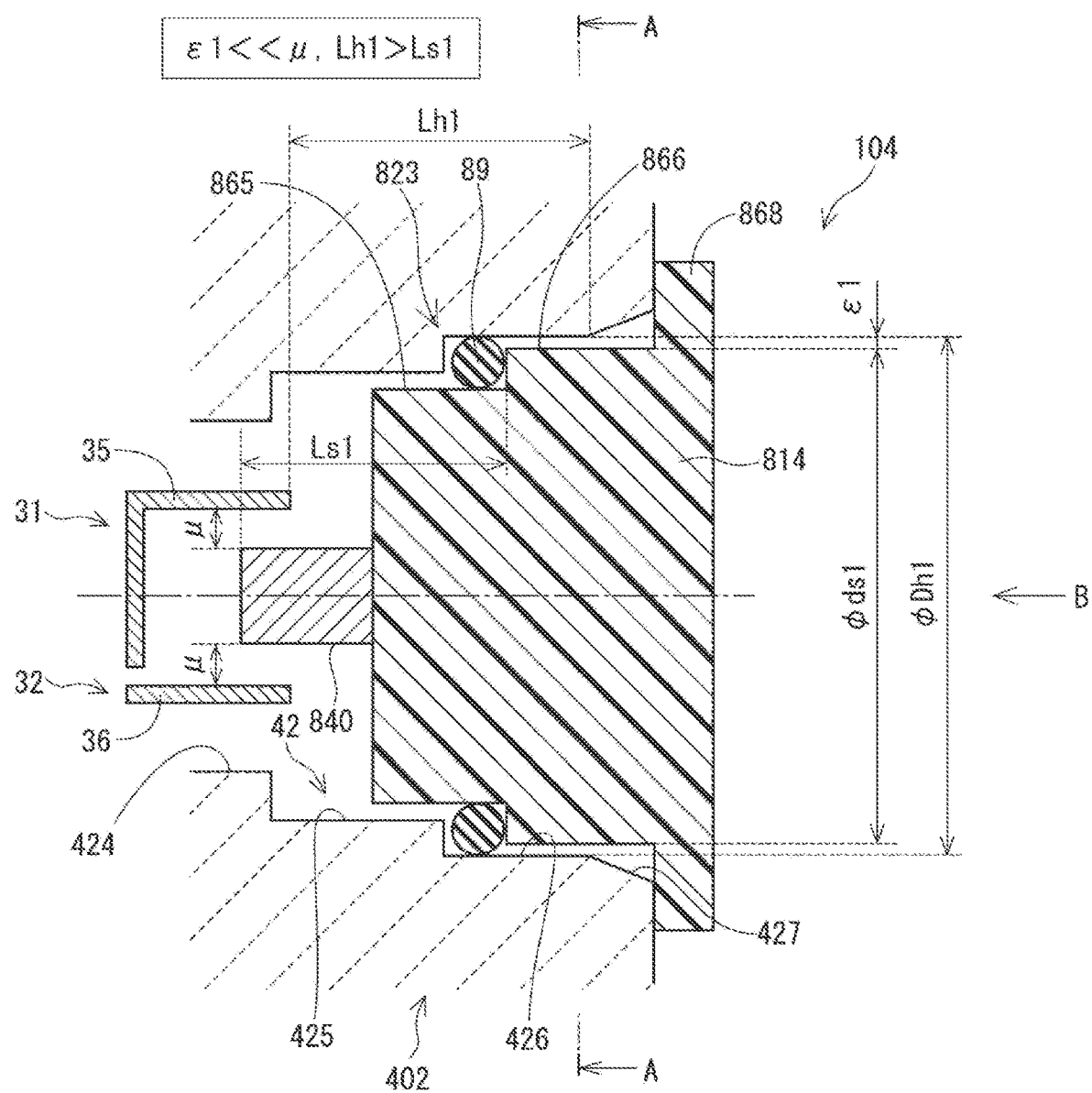
FIG. 21 is a schematic cross-sectional view (1) showing a dimensional relationship of the third and fourth embodiments.
Figure 22:
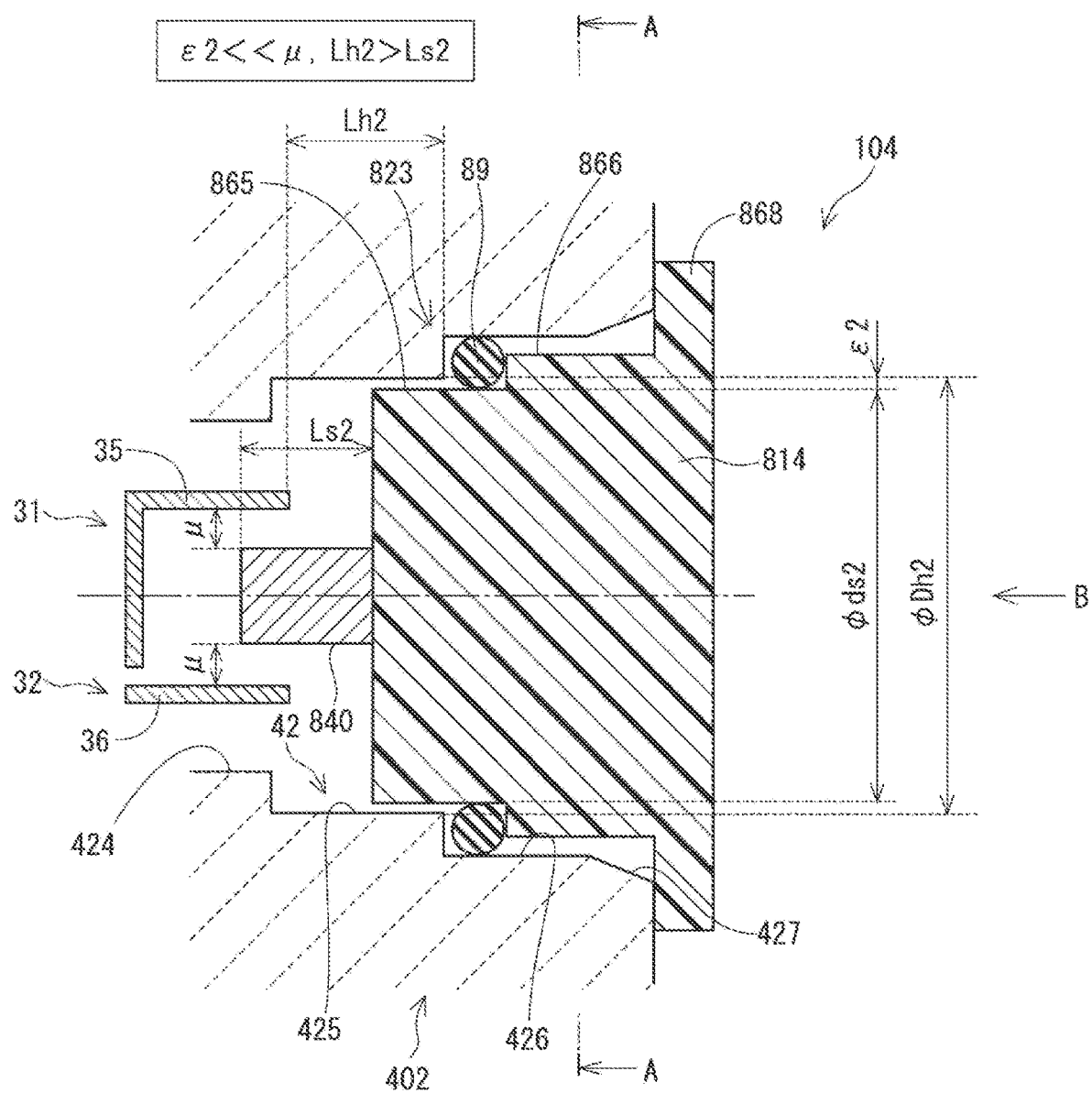
FIG. 22 is a schematic cross-sectional view (2) showing a dimensional relationship of the third and fourth embodiments.

Next, with reference to FIGS. 21 and 22, the dimensional relationship between the cap body 813 and the inner diameter of the mounting hole 42 in the torque detection device 103 of the third embodiment, or the dimensional relationship between the outer diameter of the cylindrical portion 814 and the inner diameter of the mounting hole 42 in the torque detection device 104 of the fourth embodiment. In the description of this part, terms such as "cylindrical portion 814" of the fourth embodiment are used as representatives. Regarding the third embodiment, for example, "cylindrical portion 814" may be read as "cap body 813".

The cross-sectional view of the torque detection device 104 of FIGS. 21 and 22 is schematic as in FIGS. 9A and 11A. The magnetic sensors 71 and 72 are housed in the "sensor unit 840" which is a prismatic portion protruding from the tip surface of the cylindrical portion 814. Here, "being housed" includes a configuration "being molded". If the sensor unit 840 interferes with the member on the housing 402 side due to misalignment or inclination when the magnetic detection module 904 is inserted into the mounting hole 42, the magnetic sensors 71 and 72 may be damaged or their characteristics may change. Therefore, in the fourth embodiment, interference between the sensor unit 840 and the member on the housing 402 side is prevented.

Specifically, the sensor unit 840 is inserted between the ring portions 35, 36 of the pair of yokes 31, 32 facing each other. The magnetic flux generated between the ring portions 35 and 36 passes through the sensor unit 840, so that the magnetic sensors 71 and 72 detect the magnetic flux. The minimum distance between the sensor unit 840 and the ring portions 35 and 36 is defined as "sensor margin p". As shown in FIGS. 21 and 22, when the position of the sensor unit 840 is not biased with respect to the center of the ring portions 35 and 36, the sensor margin p is half the length obtained by subtracting the thickness of the sensor unit 840 from the distance between the ring portions 35 and 36.

FIGS. 21 and 22 show examples of two patterns having different dimensional relationships regarding diameter. The dimensional symbols for each part are defined as follows. A "one-sided fitting gap" corresponds to one half of the fitting gap between the diameter of the hole and the diameter of the shaft. The letter "h" in the symbol represents the housing and the "s" represents the sensor.

$\varphi Dh1$: Inner diameter of large diameter hole 426 ($=\varphi ds1 + 2\times\varepsilon1$)

$\varphi ds1$: Outer diameter of large diameter portion 866

$\varepsilon1$: One-sided fitting gap between the large diameter hole 426 and the large diameter portion 866

$\varphi Dh2$: Inner diameter of small diameter hole 425 ($=\varphi ds2 + 2\times\varepsilon2$)

$\varphi ds2$: Outer diameter of small diameter portion 865

$\varepsilon2$: One-sided fitting gap between the small diameter hole 425 and the small diameter portion 865

In the embodiment shown in FIG. 21, the one-sided fitting gap $\varepsilon1$ between the large diameter hole 426 and the large diameter portion 866 is set to, for example, a minute gap of less than 0.1 mm. That is, the fitting of the large diameter hole 426 and the large diameter portion 866 has the spigot structure. Therefore, accuracy such as coaxiality and squareness when the cylindrical portion 814 is inserted into the mounting hole 42 is ensured. Further, the gap $\varepsilon1$ is set smaller than the sensor margin μ ($\varepsilon1<\mu$). Preferably, the gap $\varepsilon1$ is set to be much smaller than the sensor margin μ ($\varepsilon1\ll\mu$). The one-side fitting gap $\varepsilon2$ between the small diameter hole 425 and the small diameter portion 865 may be equal to or larger than the gap $\varepsilon1$.

Regarding the axial dimensions of the cylindrical portion 814 and the mounting hole 42 in this configuration, the distance from the insertion end of the large diameter hole 426 (that is, the boundary between the chamfered portion 427 and the large diameter hole 426) to the outer edge of the ring portions 35 and 36 of the yokes 31 and 32 is defined as "housing side distance Lh1". Further, the distance from the boundary between the large diameter portion 426 and the small diameter portion 425 to the tip of the sensor unit 840 is defined as "sensor side distance Ls1". The housing side distance Lh1 is set longer than the sensor side distance Ls1.

With such a dimensional setting, even if the shaft of the cylindrical portion 814 is tilted to the maximum with respect to the shaft of the mounting hole 42 and the outer wall of the large diameter portion 866 contacts the inner wall of the large diameter hole 426 on one side in the circumferential direction, the fluctuation of the tip position of the sensor unit 840 is suppressed to be smaller than the sensor margin μ. Therefore, when the magnetic detection module is inserted, it is possible to prevent the sensor unit 840 from interfering with the yokes 31 and 32 which are housing side members.

In the embodiment shown in FIG. 22, the one-sided fitting gap $\varepsilon2$ between the small diameter hole 425 and the small diameter portion 865 is set to, for example, a minute gap of less than 0.1 mm. That is, the fitting of the small diameter hole 425 and the small diameter portion 865 has the spigot structure. Therefore, accuracy such as coaxiality and squareness when the cylindrical portion 814 is inserted into the mounting hole 42 is ensured. Further, the gap $\varepsilon2$ is set to be smaller than the sensor margin μ ($\varepsilon2<\mu$). Preferably, the gap $\varepsilon2$ is set to be much smaller than the sensor margin μ ($\varepsilon2\ll\mu$). The one-side fitting gap $\varepsilon1$ between the large diameter hole 426 and the large diameter portion 866 may be equal to or larger than the gap $\varepsilon2$.

Regarding the axial dimensions of the cylindrical portion 814 and the mounting hole 42 in this configuration, the distance from the insertion end of the small diameter hole 425 (that is, the boundary between the large diameter hole 426 and the small diameter hole 425) to the outer edges of the ring portions 35 and 36 of the yokes 31 and 32 is defined as "housing side distance Lh2". Further, the distance from the tip surface of the cylindrical portion 814 to the tip of the sensor unit 840 is defined as "sensor side distance Ls2". The housing side distance Lh2 is set longer than the sensor side distance Ls2.

With such a dimensional setting, even if the shaft of the cylindrical portion 814 is tilted to the maximum with respect to the shaft of the mounting hole 42 and the outer wall of the small diameter portion 865 contacts the inner wall of the small diameter hole 425 on one side in the circumferential direction, the fluctuation of the tip position of the sensor unit 840 is suppressed to be smaller than the sensor margin μ. Therefore, when the magnetic detection module is inserted, it is possible to prevent the sensor unit 840 from interfering with the yokes 31 and 32 which are housing side members.

Next, with reference to FIGS. 23A to 25B, a configuration for restricting rotation and preventing erroneous assembly of the cylindrical portion 814 with respect to the mounting hole 42 will be described. For example, in the prior art of Patent Document 2 (U.S. Pat. No. 4,753,545), the magnetic ring is arranged in the outer diameter direction of the magnetic yoke and faces the magnetic yoke in the radial direction. In this configuration, it is effective to secure the concentricity between the magnetic ring and the magnetic yoke by positioning, but the position accuracy in the rotation direction does not significantly affect the performance. On the other hand, in the torque detection device 104 of the fourth embodiment in which the magnetic sensors 71 and 72 are arranged between the ring portions 35 and 36 of the set of yokes 31 and 32, positioning of the cylindrical portion 814 with respect to the mounting hole 42 in the rotational direction is important. Further, it is important to prevent the magnetic detection module 904 from being assembled in the wrong direction by, for example, 180°.

Figure 23A:
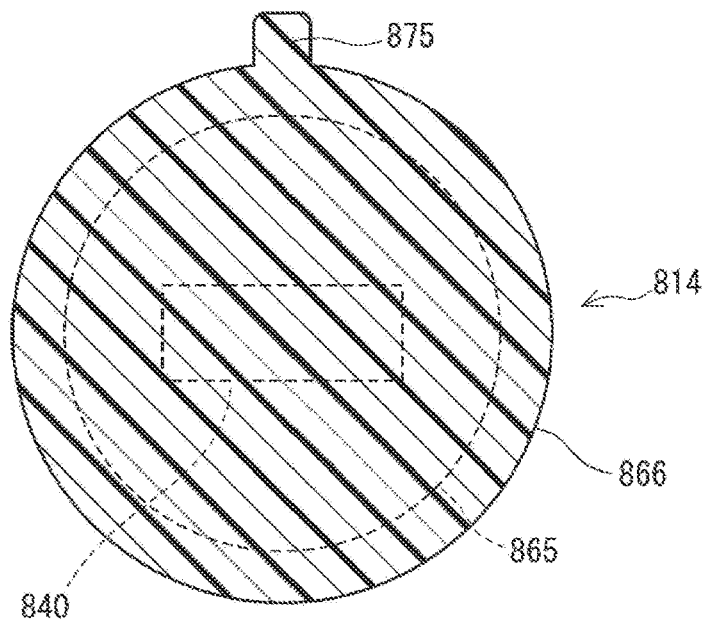
FIG. 23A is a cross-sectional view of a cylindrical portion in the A-A line cross section of FIGS. 21 and 22 showing the shape example 1 of a rotation regulation (prevention of erroneous assembly) portion.
Figure 23B:
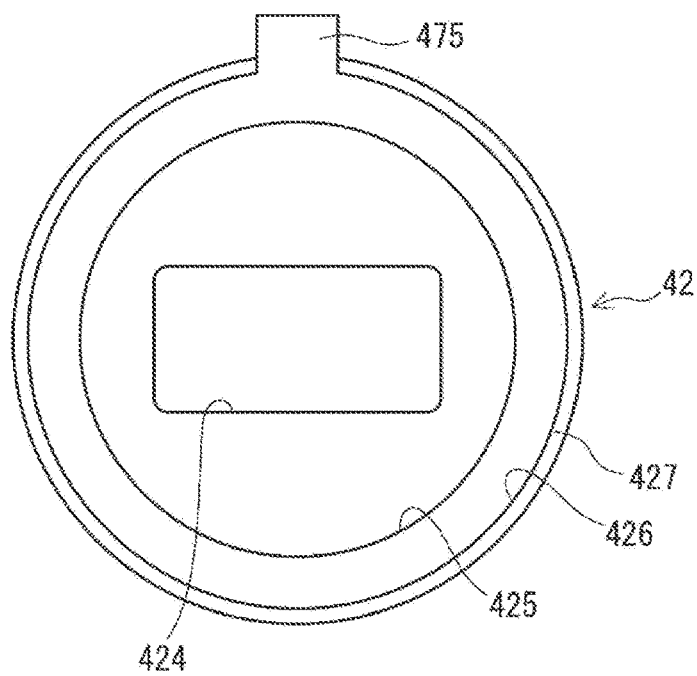
FIG. 23B is a front view of a housing mounting hole according to an arrow in a B direction of FIGS. 21 and 22, which shows a shape example 1 of a rotation regulation (prevention of erroneous assembly) portion.
Figure 24A:
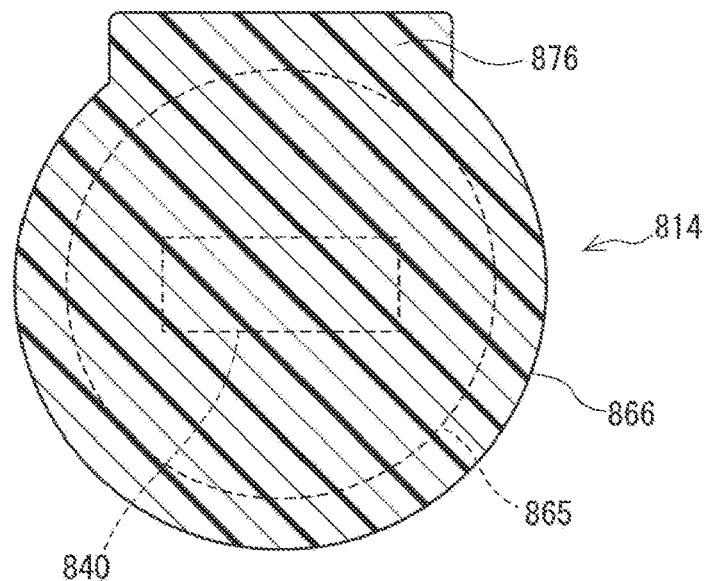
FIG. 24A shows a shape example 2 of the rotation regulation (prevention of erroneous assembly) portion, and is a diagram conforming to FIG. 23A.
Figure 24B:
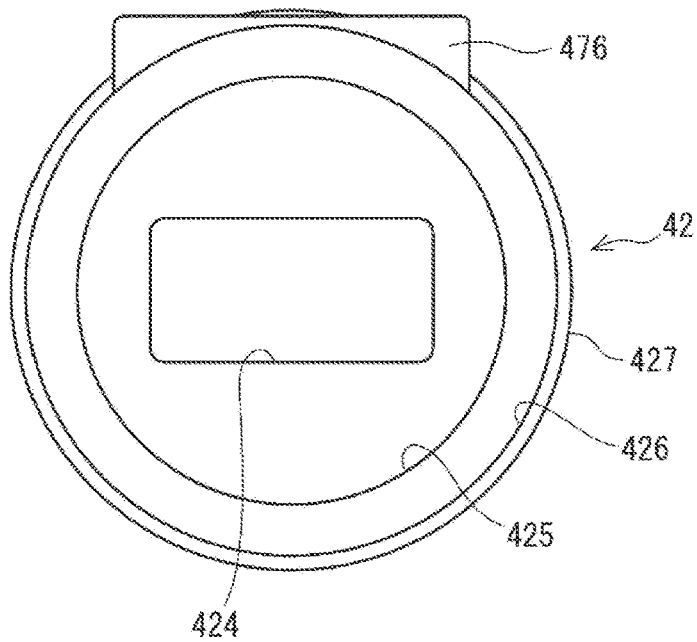
FIG. 24B shows a shape example 2 of the rotation regulation (prevention of erroneous assembly) portion, and is a diagram conforming to FIG. 23B.
Figure 25A:
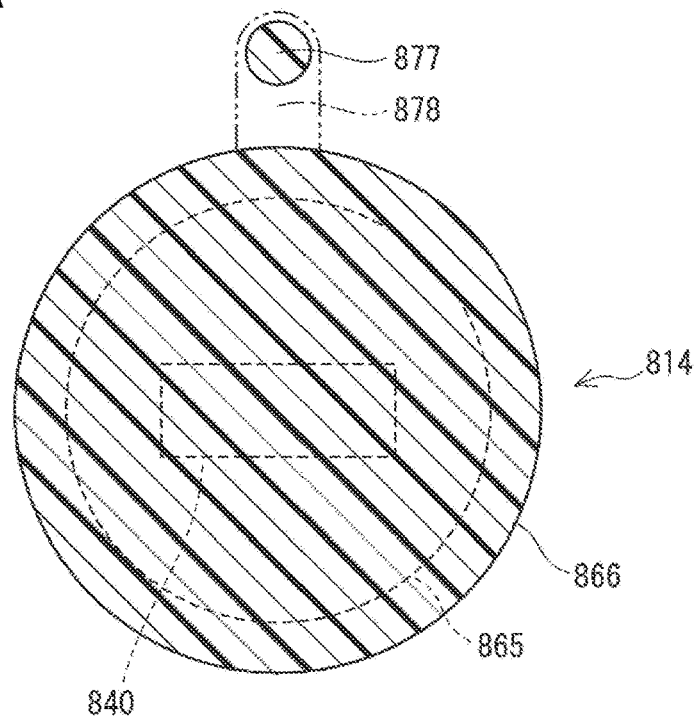
FIG. 25A shows a shape example 3 of the rotation regulation (prevention of erroneous assembly) portion, and is a diagram conforming to FIG. 23A.
Figure 25B:
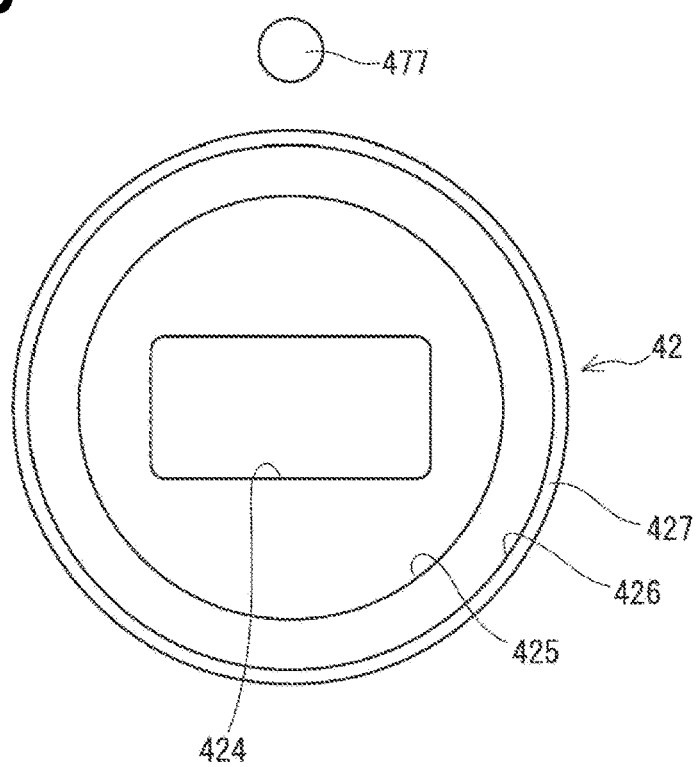
FIG. 25B shows a shape example 3 of the rotation regulation (prevention of erroneous assembly) portion, and is a diagram conforming to FIG. 23B.

FIGS. 23A, 24A, and 25A show the cross section of the cylindrical portion 814 in the cross section taken along the line A-A of FIGS. 21 and 22. FIGS. 23B, 24B, and 25B show the front view of the mounting hole of the housing according to the arrow in the B direction in FIGS. 21 and 22. The parts where the assembly cross sections of FIGS. 21 and 22 are changed according to each of the shapes of FIGS. 23A to 25B are not shown. Further, for example, when used for a column-mounted type that does not require waterproofing, the O-ring 89 may be eliminated in each figure.

In the example shown in FIGS. 23A and 23B, a protrusion portion 875 protruding in the outer diameter direction is formed at one position in the circumferential direction of the large diameter portion 866. Further, a rotation restricting groove 475 is formed at a corresponding portion of the mounting hole 42. This configuration example is similar to the configuration example of the protrusion portion 871 and the rotation regulation portion 471 in FIGS. 3A, 3B, 4 and the like. However, in the example of FIG. 4, the protrusion portion 871 is formed on the outer periphery of the outer flange portion 863 inserted into the spigot hole 423, whereas the example of FIG. 23A is different in that the protrusion portion 875 is formed on the outer periphery of the large diameter portion 866. As described above, there is no essential difference regardless of which part of the outer peripheral surface of the cylindrical portion 814 the protrusion is formed.

In this example, the rotation of the cylindrical portion 814 is restricted by engaging the protrusion portion 875 with the rotation restricting groove 475. Further, it is possible to assemble only in a posture in which the relative angle between the cylindrical portion 814 and the mounting hole 42 is located at a regular angle, and the erroneous assembly is prevented in a posture located at a posture other than the predetermined relative angle. In this way, the protrusion portion 875 and the rotation restricting groove 475 function as both a "misassembling prevention portion" and a "rotation regulation portion".

In the example shown in FIGS. 24A and 24B, a flat portion 876 is formed on one side of the large diameter portion 866 in the circumferential direction. Further, a rotation restricting recess 476 is formed at a corresponding portion of the mounting hole 42. The flat portion 876 corresponds to a form in which the width of the protrusion portion 875 is widened and the protrusion length with respect to the outer diameter of the large diameter portion 866 is shortened. In the example of FIG. 24A, the protrusion length of the flat portion 876 with respect to the outer diameter of the large diameter portion 866 is set to be substantially 0. Further, the flat portion 876 may be formed on the minus side (that is, the center side) with respect to the outer diameter of the large diameter portion 866, and the outer peripheral shape of the large diameter portion 866 may be a D shape in which a part in the circumferential direction is connected by a straight line. In this example, when the flat portion 876 engages with the rotation restricting recess 476, the flat portion 876 and the rotation restricting recess 476 function as both a "misassembling prevention portion" and a "rotation regulation portion".

In the example shown in FIGS. 25A and 25B, a separation portion 877 is formed at a position separated in the outer diameter direction from the circular large diameter portion 866. The separation portion 877 is connected to a collar portion 868 via a connecting portion 878 indicated by the alternate long and short dash line. Further, a rotation restricting hole 477 is formed at a corresponding portion of the mounting hole 42. For example, when the rotation control hole 477 is formed in the housing 402 by post-processing, the processing is easy because the shape is simple. In this example, the separation portion 877 is fitted into the rotation restricting hole 477, so that the separation portion 877 and the rotation restricting hole 477 function as both the "misassembling prevention portion" and the "rotation regulation portion".

In each of the configurations of FIGS. 23A to 25B, the positions of the protrusion portion 875, the flat portion 876, and the separation portion 877 are not limited to the shown positions, and may be any position in the circumferential direction. Further, a plurality of these portions may be arranged in the circumferential direction. However, when functioning as a "misassembling prevention portion", a plurality of these portions need to be arranged at rotationally asymmetrical positions so that there are no plurality of rotationally symmetric positions. Further, as in the modified example of the first embodiment shown in FIGS. 9A to 12, a convex portion may be provided on the housing 402 side.

Figure 26A:
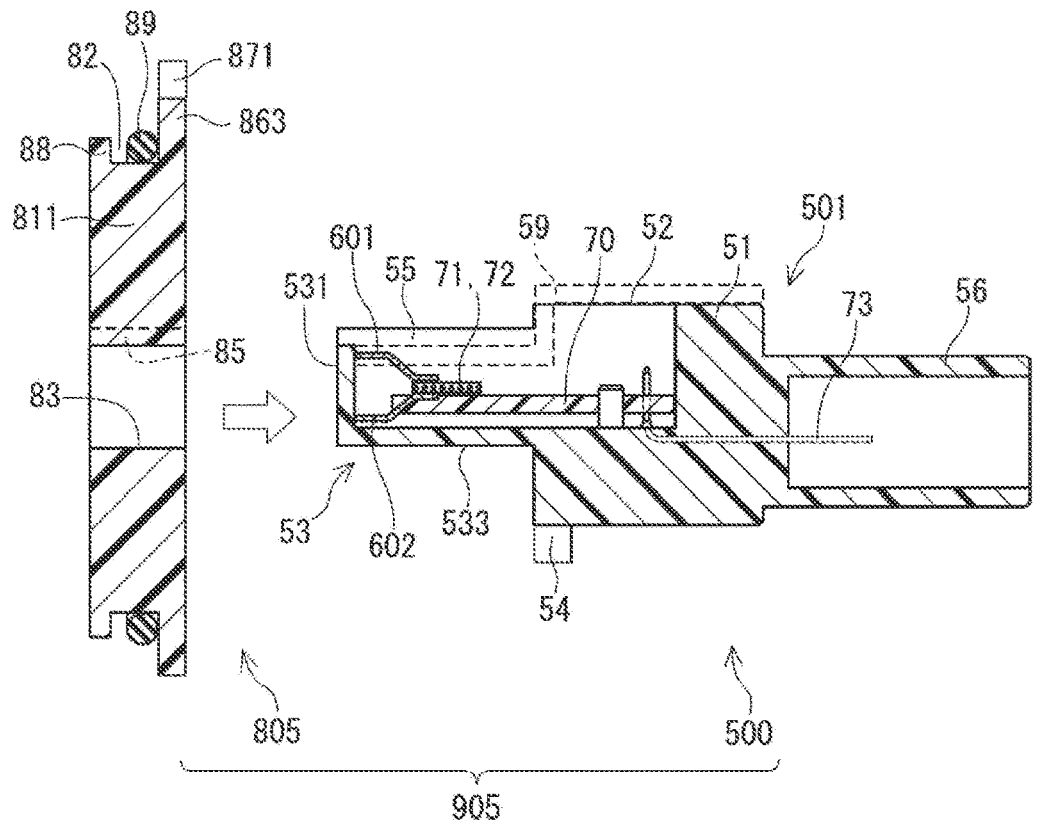
FIG. 26A is a cross-sectional view of a cap and case assembly using cap of other embodiments.
Figure 26B:
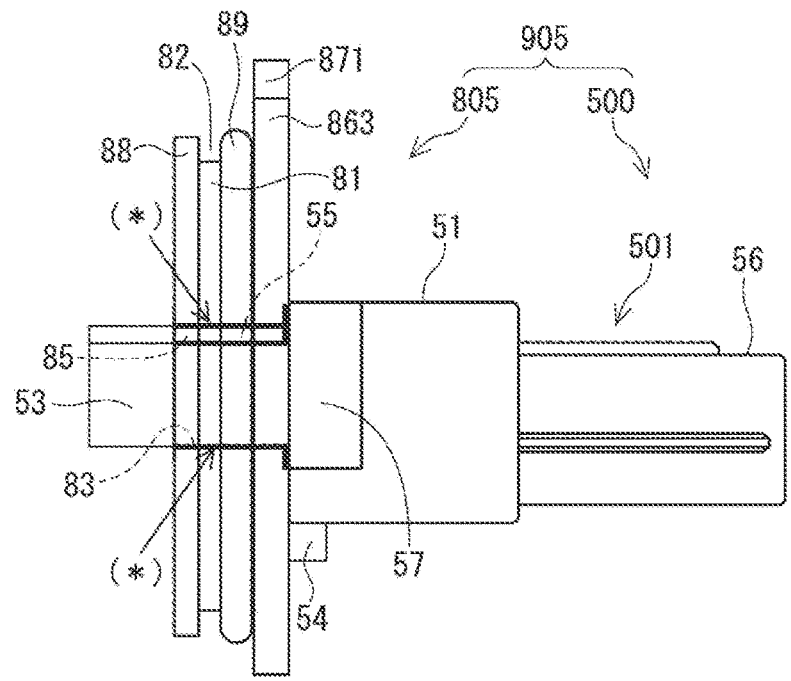
FIG. 26B is a side view of the magnetic detection module with the cap of other embodiment mounted on the case assembly.

Other Embodiments (A) The cap 801 in the form shown in FIGS. 4 to 8B has a bag-shaped sealing portion 84 formed at the tip thereof. However, as the cap 801, a cap 805 whose tip is not bag-shaped may be used as in the magnetic detection module 905 shown in FIG. 26. Compared to the form in which the sealing portion 84 is formed at the tip, in this form, the distance (gap) between the yokes 31 and 32 and the facing portions of the magnetic flux guiding members 601, 602 is smaller by the thickness of the resin at the tip, so that the sensitivity can be improved. In this case, in order to prevent water from entering from the interface between the cap 805 and the case 501, it is necessary that the contact portion shown by the portion (*) in FIG. 26B is sealed with laser welding or an adhesive.

(B) In the first and second embodiments, the O-ring 89 as a sealing member is mounted in the outer peripheral groove 82 of the cap 801 and is used for the shaft seal between the O-ring 89 and the inner wall of the mounting hole 42 of the housing 402. As another sealing member, an O-ring, packing, gasket, or the like used for surface sealing may be provided on the cap. Further, the sealing member is not limited to the one for waterproofing, and may be one for oil sealing or gas sealing. Further, the shape of the portion of the outer periphery of the cap body 811 on which the O-ring 89 is mounted is not limited to the outer peripheral groove 82, and may be a stepped shape in the radial direction as in the third and fourth embodiments.

(C) In the first and second embodiments, attachment to two types of housings 401 and 402 being waterproof and non-waterproof, can be selected depending on whether or not the cap 801 is attached to the case 501. In addition, for example, if there are O-ring specifications for shaft seals and packing specifications for surface seals among waterproof specifications, or if there are specifications with different sizes of O-rings, a cup suitable for each specification may be selected and attached to the case. Alternatively, the cap may be attached to the case as an adapter for a plurality of non-waterproof housings having different shapes and sizes of mounting portions.

(D) The number of magnetic sensors included in the magnetic detection module is not limited to two as exemplified in the above embodiment, and may be one or three or more. Further, the magnetic detection module does not include the magnetic flux guiding members 601 and 602, and the magnetic flux generated in the housing 40 may be directly transmitted from the set of yokes 31 and 32 to the magnetic sensors 71 and 72. In the configuration including the magnetic flux guiding members 601 and 602, the shape of the main body of the magnetic flux guiding member is not limited to the linear shape, but may be an arc shape along the yoke or the like, and the extension may not be provided. Further, the magnetic flux guiding member may face the set of yokes 31 and 32 in the radial direction instead of the axial direction.

(E) The case 501 and the cap 801 are not limited to resin molded products, and may be manufactured of other materials that do not affect magnetic detection. Further, the method of attaching the cap 801 to the case 501 is not limited to the method of inserting the insertion portion 53 of the case 501 into the receiving hole 83 of the cap 801 and welding or adhering the joint portion, and for example, the cap 801 may be attached to the case 501 by press fitting or the like.

(F) The shapes of the misassembling prevention portion and the rotation regulation portion to the housings 401 and 402 are not limited to the protrusion portion, groove, and the like shown in the above embodiment. In addition, the positions and numbers of the misassembling prevention portion and the rotation regulation portion may be appropriately set. Further, the form is not limited to a form having both functions, and may have only a misassembling prevention function or only a rotation regulation function. For example, the asymmetrical shape may form a misassembling prevention portion. In addition, if the purpose of misassembling prevention or rotation regulation is achieved by other configurations, the misassembling prevention portion or rotation regulation portion may not be provided.

(G) The cylindrical portion 814 of the fourth embodiment is not limited to a cylindrical shape, and may be formed as a "cylindrical portion" including an elliptical cylinder shape, a long cylinder shape, a polygonal cylinder shape, and the like. The same applies to the cap body 813 of the third embodiment. If it is an elliptical cylinder portion or a long cylinder portion, a sealing function by an O-ring is also ensured. In addition, if it is an elliptical cylinder portion, it can be expressed using "diameter", but if it is difficult to apply the concept of "diameter" to a non-cylindrical cylinder portion, the large diameter part may be generalized as a "large shaft part" and the small diameter part may be generalized as a "small shaft part".

Further, the large diameter hole and the small diameter hole of the mounting holes facing each other may be generalized as "large holes" and "small holes". Further, the direction orthogonal to the axial direction of the cylindrical portion and from the center to the peripheral edge is defined as a pseudo "diameter direction", and the gap between the shaft portion and the hole on one side in the radial direction in the spigot structure is referred to as "one-sided fitting gap".

(H) The detection device of the present disclosure or the detection device to which the magnetic detection module of the present disclosure is applied is not limited to the torque detection device of the electric power steering device, and the detection device may detect the magnetic flux generated according to the magnitude of the physical quantity to be detected. The generated magnetic flux is transmitted by a set of yokes provided inside the housing and detected by the magnetic sensor of the magnetic detection module. For example, it can be used as a rotation detection device, a position detection device, or the like that detects magnetic flux generated in response to rotation or linear movement of a movable body.

The present disclosure should not be limited to the embodiment described above. Various other embodiments may be implemented without departing from the scope of the present disclosure.

The present disclosure has been made in accordance with the embodiments. However, the present disclosure is not limited to such embodiments and configurations. The present disclosure also encompasses various modifications and variations within the scope of equivalents. Furthermore, various combination and formation, and other combination and formation including one, more than one or less than one element may be made in the present disclosure.

What is claimed is:

1. A detection device, comprising:
a housing including a mounting hole provided inside with a set of yokes that transmit the magnetic flux generated according to a magnitude of a physical quantity to be detected; and a magnetic detection module mounted in the mounting hole in the housing and configured to detect the magnetic flux transmitted from the yoke by one or more magnetic sensors housed in a case,
wherein
the set of yokes has ring portions that face each other and form a magnetic circuit,
the magnetic detection module includes a cylindrical portion which is inserted into the mounting hole and faces an inner wall of the mounting hole, and a sensor unit in which the magnetic sensor is housed and protrudes from a tip end surface of the cylindrical portion and is inserted between the ring portions of the set of the yokes,
the cylindrical portion and the housing include misassembling prevention portions, when assembling the magnetic detection module to the housing, it is possible to assemble only in a posture located at a predetermined relative angle, and to prevent erroneous assembly in a posture other than the predetermined relative angle,
in a direction orthogonal to an axial direction of the mounting hole and the cylinder portion, when a minimum distance between the sensor unit and the ring portion is defined as a sensor margin, an one-sided fitting gap between the mounting hole and the cylindrical portion is set to be smaller than the sensor margin.

2. The detection device according to claim 1, wherein the misassembling prevention portion also functions as a rotation regulation portion that regulates rotation of the housing after the magnetic detection module is assembled to the housing.

3. The detection device according to claim 1, wherein the cylindrical portion is integrally formed with the case.

4. The detection device according to claim 1, wherein the cylindrical portion is composed of a plate-shaped cap body of a cap attached to an end portion of the case.

5. The detection device according to claim 1, wherein an O-ring as a sealing member used for shaft sealing is mounted on the outer periphery of the small shaft portion of the cylindrical portion with the inner wall of the mounting hole of the housing.

6. The detection device according to claim 1, further comprising:
   a torsion bar that twists and displaces according to torque and is provided in the housing, and
   a multipolar magnet that is fixed to one end side of the torsion bar and is provided in the housing, wherein
   the set of yokes is fixed to the other end side of the torsion bar, forms a magnetic circuit in the magnetic field of the multipole magnet, and has the ring portion outside the diameter of the multipole magnet, and
   the detection device functions as a torque detection device that detects the magnetic flux transmitted from the yoke by the magnetic sensor and detects the torque applied to the torsion bar.

* * * * *